US008169030B2

(12) United States Patent
Masuoka et al.

(10) Patent No.: US 8,169,030 B2
(45) Date of Patent: May 1, 2012

(54) SEMICONDUCTOR MEMORY DEVICE AND PRODUCTION METHOD THEREOF

(75) Inventors: Fujio Masuoka, Tokyo (JP); Shintaro Arai, Tokyo (JP)

(73) Assignee: Unisantis Electronics Singapore Pte Ltd., Peninsula Plaza (SG)

( * ) Notice: Subject to any disclaimer, the term of this patent is extended or adjusted under 35 U.S.C. 154(b) by 109 days.

(21) Appl. No.: 12/881,554

(22) Filed: Sep. 14, 2010

(65) Prior Publication Data

US 2011/0062523 A1 Mar. 17, 2011

Related U.S. Application Data

(60) Provisional application No. 61/276,770, filed on Sep. 15, 2009.

(30) Foreign Application Priority Data

Sep. 14, 2009 (JP) .................................. 2009-211300

(51) Int. Cl.
*H01L 27/088* (2006.01)
(52) U.S. Cl. ........ 257/368; 257/338; 257/328; 257/329; 257/E27.098
(58) Field of Classification Search ................... 257/368, 257/338, 328, 329, E27.098
See application file for complete search history.

(56) References Cited

U.S. PATENT DOCUMENTS

| 4,670,768 | A | 6/1987 | Sunami et al. |
| 5,293,053 | A | 3/1994 | Malhi et al. |
| 6,583,452 | B1 * | 6/2003 | Cho et al. ...................... 257/107 |
| 6,967,358 | B2 * | 11/2005 | Nemati et al. ................. 257/133 |
| 7,285,604 | B2 * | 10/2007 | Furumi et al. ................. 525/540 |
| 2011/0215371 | A1 * | 9/2011 | Tang .............................. 257/133 |

FOREIGN PATENT DOCUMENTS

| EP | 2239770 A1 | 10/2010 |
| JP | 02-188966 A | 7/1990 |
| JP | 07-099311 A | 4/1995 |
| JP | 2000-012705 A | 1/2000 |
| WO | WO 2009/096466 A1 | 8/2009 |

OTHER PUBLICATIONS

Extended European Search Report for European Application No. 10009572.8, dated Dec. 2, 2010, 9 pages.
Examination Report from counterpart European Application No. 10009572.8, dated Jul. 28, 2011, 8 pages.

* cited by examiner

*Primary Examiner* — Eugene Lee
(74) *Attorney, Agent, or Firm* — Brinks Hofer Gilson & Lione

(57) ABSTRACT

In a static memory cell composed of four MOS transistors, the transistors composing a memory cell are formed on a substrate and have a drain, gate, and source arranged vertically with the gate surrounding a columnar semiconductor layer. In this memory cell, the first diffusion layers (second diffusion layers) functioning as a first memory node (second memory node) are connected via a first silicide layer (second silicide layer) formed on their surfaces, whereby an SRAM cell having a small area is realized. Furthermore, a first anti-leak diffusion layer (second anti-leak diffusion layer) having the conductivity type opposite to the first well is formed between the first well and the first diffusion layer (second diffusion layer) having the same conductivity type as the first well so as to prevent leak to the substrate.

12 Claims, 21 Drawing Sheets

(12) United States Patent
US 8,169,030 B2

SEMICONDUCTOR MEMORY DEVICE AND PRODUCTION METHOD THEREOF

RELATED APPLICATIONS

Pursuant to 35 U.S.C. §119(e), this application claims the benefit of the filing date of Provisional U.S. Patent Application Ser. No. 61/276,770 filed on Sep. 15, 2009. This application also claims priority under 35 U.S.C. §119(a) to JP2009-211300 filed on Sep. 14, 2009. The entire contents of these applications are hereby incorporated by reference.

BACKGROUND OF THE INVENTION

1. Field of the Invention

The present invention relates generally to a semiconductor memory device and particularly to a semiconductor memory device composed of an SRAM (static random access memory).

2. Description of the Related Art

SGT (surrounding gate transistor) technologies are known as measures for attaining higher levels of integration and performance in semiconductor devices (disclosed for example in Unexamined Japanese Patent Application KOKAI Publication Nos. H2-188966 and H7-99311). SGTs are vertical gate transistors in which a columnar semiconductor layer is formed on the surface of a semiconductor substrate and a gate is formed on the sidewall of the columnar semiconductor layer to surround it. In an SGT, the drain, gate, and source are arranged in the vertical direction. Therefore, the SGT has a significantly reduced occupying area compared with conventional planar transistors.

With the increasingly strong demands in recent years for large capacity SRAMs installed in LSIs (large-scale integrated circuits), it is desired to realize an SRAM having a small cell area with the use of SGTs.

FIG. 19A is a plane view of a CMOS 6T-SRAM memory cell composed of six SGTs, which is shown in an embodiment of Unexamined Japanese Patent Application KOKAI Publication No. H7-99311 and FIG. 19B is a cross-sectional view at A-A' in FIG. 19A. In these figures, bit lines (801a, 801b) are formed by an n+ diffusion layer, a ground potential wire GND is formed by an n+ diffusion layer 802, and a power supply potential wire Vcc is formed by a p+ diffusion layer 803.

Columnar silicon layers composing access transistors (810a, 810b) for accessing the memory cell, driver transistors (811a, 811b) for driving the memory cell, and load transistors (812a, 812b) for supplying charge to the memory cell, respectively, are formed on these diffusion layers. Gates (804a, 804b, 804c, 804d) are formed around the columnar silicon layers. Memory nodes are composed of wiring layers (807a, 807b).

In the above memory cell (SRAM cell), the transistors each have the source, gate, and drain arranged vertically on the columnar silicon layer. Therefore, a small SRAM cell can be designed.

The above SRAM cell can attain a small cell area when the power supply potential wire 803 and ground potential wire 802 have approximately the minimum dimensions. However, the power supply potential wire 803 and ground potential wire 802 are formed by a p+ diffusion layer and an n+ diffusion layer, respectively. Therefore, they have significantly high resistance and it is difficult to achieve high SRAM operation speeds when they have approximately the minimum dimensions. On the other hand, when the power supply potential wire 803 and ground potential wire 802 are increased in dimension for high SRAM operation speeds, the SRAM cell has a larger area.

In SRAMs using conventional planar transistors, the power supply potential wire and ground potential wire are formed by low resistant Cu wires. Therefore, it is essential to form the power supply potential wire and ground potential wire by Cu wires in order for SRAMs using SGTs to achieve operation speeds equivalent to those of SRAMs using planar transistors.

Loadless 4T-SRAMs have been proposed as an SRAM having an SRAM cell area smaller than CMOS 6T-SRAMs (disclosed for example in Unexamined Japanese Patent Application KOKAI Publication No. 2000-12705). FIG. 1 shows an equivalent circuit to a memory cell of the loadless 4T-SRAM. This SRAM cell is composed of a total of four transistors: two PMOS access transistors (Qp11, Qp21) for accessing the memory and two NMOS driver transistors (Qn11, Qn21) for driving the memory.

Data holding operation in the case wherein data "L" is stored in a memory node Qa1 and data "H" is stored in a memory node Qb1 will be described hereafter as an example of operation of the memory cell in FIG. 1. A word line WL1 and bit lines BL1 and BLB1 all have a potential "H" while data is held. The threshold of the access transistors (Qp11, Qp21) is lower than the threshold of the driver transistors (Qn11, Qn21). The off-leak current of the access transistors (Qp11, Qp21) is, for example, approximately 10 to 1000 times larger in average than the off-leak current of the driver transistors (Qn11, Qn21). Therefore, the level "H" of the memory node Qb1 is held by an off-leak current running from the bit line BLB1 to the memory node Qb1 via the access transistor Qp21. On the other hand, the level "L" of the memory node Qa1 is stably held by the driver transistor Qn11.

The above loadless 4T-SRAM can attain a smaller SRAM cell area than CMOS 6T-SRAMs even with the use of SGTs.

SUMMARY OF THE INVENTION

The present invention is made in view of the above circumstances and the purpose of the present invention is to attain an SRAM cell having a small area and sufficient operational margin in a loadless 4T-SRAM using SGTs.

In order to achieve the above purpose, the semiconductor memory device of the present invention is: a semiconductor memory device comprising a static memory cell composed of four MOS transistors arranged on a substrate, wherein the four MOS transistors in each of which a source diffusion layer, a drain diffusion layer, and a columnar semiconductor layer are formed on the substrate in a vertical hierarchical structure, the columnar semiconductor layer is provided between the source diffusion layer and drain diffusion layer, and a gate electrode is formed on the sidewall of the columnar semiconductor layer function as first and second PMOS access transistors for supplying charge to hold memory cell data and accessing the memory and as first and second NMOS driver transistors for driving memory nodes to read memory cell data; the first PMOS access transistor and first NMOS driver transistor adjoin each other; the second PMOS access transistor and second NMOS driver transistor adjoin each other; a first well giving a potential to the substrate and common to multiple memory cells is formed in the substrate; a first P type diffusion layer formed at the bottom of the first PMOS access transistor and a first N type diffusion layer formed at the bottom of the first NMOS driver transistor are connected to each other via a first silicide layer formed on their surfaces; the mutually connected first P type diffusion layer and first N type diffusion layer function as a first memory node for holding data stored in the memory cell; a first anti-leak diffusion layer having the conductivity type opposite to the first well is formed between the first N type diffusion layer or the first P type diffusion layer and first well in order to prevent leak between the first N type diffusion layer or the first P type diffusion layer and first well; the first anti-leak diffusion layer is directly connected to the first P type diffusion layer or the first N type diffusion layer; a second P type diffusion layer formed at the bottom of the second PMOS access transistor and a second N type diffusion layer formed at the bottom of the second NMOS driver transistor are connected to each other via a second silicide layer formed on their surfaces; the mutually connected second P type diffusion layer and second N type diffusion layer function as a second memory node for holding data stored in the memory cell; a second anti-leak diffusion layer having the conductivity type opposite to the first well is formed between the second N type diffusion layer or the second P type diffusion layer and first well in order to prevent leak between the second N type diffusion layer or the second P type diffusion layer and first well; and the second anti-leak diffusion layer is directly connected to the second P type diffusion layer or the second N type diffusion layer.

The above-described semiconductor memory device may be structured as follows: the first anti-leak diffusion layer is formed between the first N type diffusion layer and the first well in order to prevent leak between the first N type diffusion layer and first well; the first anti-leak diffusion layer is directly connected to the first P type diffusion layer; the second anti-leak diffusion layer is formed between the second N type diffusion layer and first well in order to prevent leak between the second N type diffusion layer and first well; and the second anti-leak diffusion layer is directly connected to the second P type diffusion layer.

Or, the above-described semiconductor memory device may be structured as follows: the first anti-leak diffusion layer is formed between the first P type diffusion layer and first well in order to prevent leak between the first P type diffusion layer and first well; the first anti-leak diffusion layer is directly connected to the first N type diffusion layer; the second anti-leak diffusion layer is formed between the second P type diffusion layer and first well in order to prevent leak between the second P type diffusion layer and first well; and the second anti-leak diffusion layer is directly connected to the second N type diffusion layer.

Furthermore, in another preferable mode of the present invention, the above-described semiconductor memory device is structured as follows: at least one of the contacts formed on gate wires extending from the gate electrodes of the first and second PMOS access transistors is a common contact also used as the contact formed on a gate wire extending from the gate electrode of a PMOS access transistor of an adjacent memory cell.

Furthermore, in another preferable mode of the present invention, a gate wire extending from the gate of the first NMOS driver transistor formed on the first diffusion layer functioning as the first memory node is connected by a common contact shared with the second diffusion layer functioning as the second memory node; and a gate wire extending from the gate of the second NMOS driver transistor formed on the second diffusion layer functioning as the second memory node is connected by a common contact shared with the first diffusion layer functioning as the first memory node.

Furthermore, in another preferable mode of the present invention, the circumference of the sidewalls of the columnar semiconductor layers forming the first and second NMOS driver transistors are equal to or longer than the circumference of the sidewalls of the columnar semiconductor layers forming the first and second PMOS access transistors; or the circumference of the sidewalls of the columnar semiconductor layers forming the first and second NMOS driver transistors are equal to or smaller than the circumference of the sidewalls of the columnar semiconductor layers forming the first and second PMOS access transistors.

Furthermore, possibly, the four MOS transistors are arranged in two rows and two columns on the substrate; the first PMOS access transistor is arranged at the row 1 column 1; the first NMOS driver transistor is arranged at the row 2 column 1; the second PMOS access transistor is arranged at the row 1 column 2; and the second NMOS driver transistor is arranged at the row 2 column 2.

Furthermore, the contact formed on a gate wire extending from the gate electrodes of the first and second PMOS access transistors can be shared.

Furthermore, the four MOS transistors can be arranged in the following manner: the first PMOS access transistor and second PMOS access transistor adjoin each other; a first contact is so provided on the first diffusion layer as to adjoin the first PMOS access transistor in one direction orthogonal to the adjoining direction of the first and second PMOS access transistors; a second contact is so provided on the second diffusion layer as to adjoin the second PMOS access transistor in the other direction orthogonal to the adjoining direction of the first and second PMOS access transistors; the first NMOS driver transistor adjoins the first PMOS access transistor in one direction orthogonal to the adjoining direction of the first and second PMOS access transistors; and the second NMOS driver transistor adjoins the second PMOS access transistor in the other direction orthogonal to the adjoining direction of the first and second PMOS access transistors.

Furthermore, the four MOS transistors can be arranged in the following manner: the first PMOS access transistor and second PMOS access transistor adjoin each other; the first NMOS driver transistor adjoins the first PMOS access transistor in one direction orthogonal to the adjoining direction of the first and second PMOS access transistors; a third contact is formed on the diffusion layer between the first NMOS driver transistor and first PMOS access transistor; the second NMOS driver transistor adjoins the second PMOS access transistor in the other direction orthogonal to the adjoining direction of the first and second PMOS access transistors; and a fourth contact is formed on the diffusion layer between the second NMOS driver transistor and second PMOS access transistor.

Furthermore, at least one of the contacts formed in the upper parts of the columnar semiconductor layers forming the first and second PMOS access transistors can be a common contact also used as the contact formed in the upper part of a columnar semiconductor layer forming a PMOS access transistor of an adjoining memory cell.

The semiconductor memory device production method of the present invention is a method of producing the above-described semiconductor memory device wherein: the contacts formed on the columnar semiconductor layers and the contacts formed on the substrate or the contacts formed on the gate wires are formed in different lithography steps or etching steps.

BRIEF DESCRIPTION OF THE DRAWINGS

A more complete understanding of this application can be obtained when the following detailed description is considered in conjunction with the following drawings, in which.

DETAILED DESCRIPTION OF THE PREFERRED EMBODIMENTS

Embodiments of the present invention will be described hereafter in detail with reference to the drawings. In the embodiments below, it is assumed that the semiconductor memory device of the present invention is constructed by a loadless 4T-SRAM.

Embodiment 1

Figure 1:
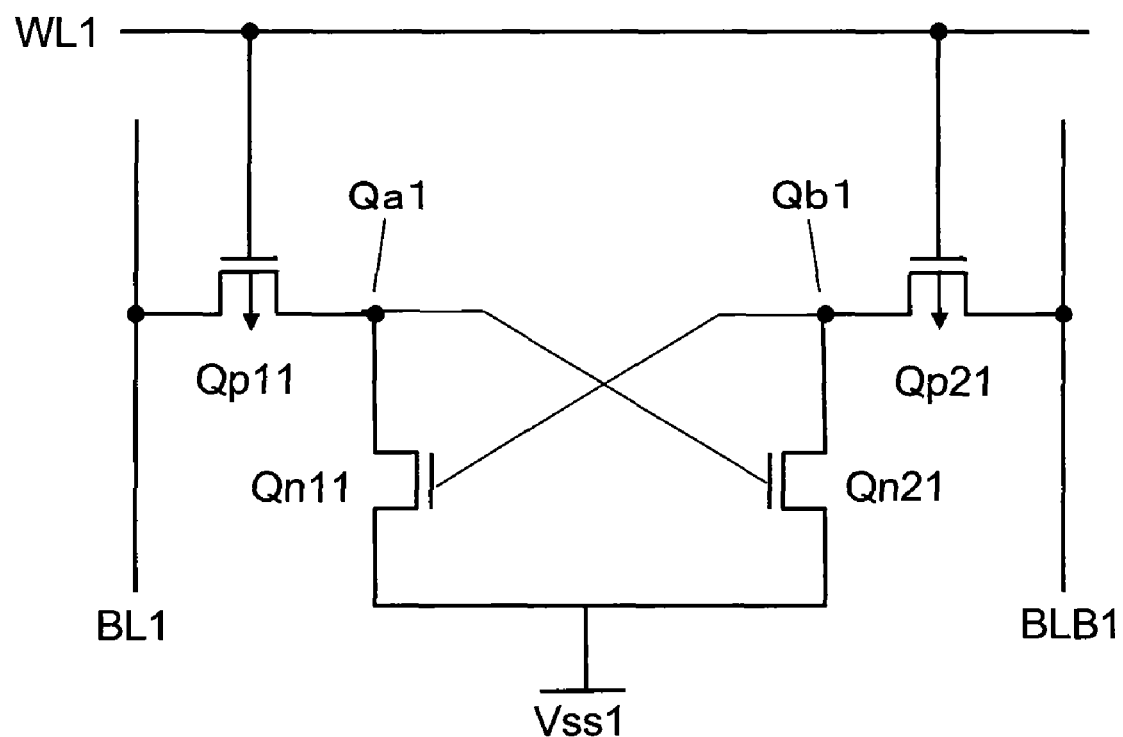
FIG. 1 is an equivalent circuit showing an SRAM according to Embodiment 1 of the present invention.

FIG. 1 shows an equivalent circuit to a memory cell (SRAM cell) that constitutes a loadless 4T-SRAM cell according to Embodiment 1. In FIG. 1, BL1 and BLB1 are bit lines, WL1 is a word line, Vss1 is a ground potential, Qp11 and Qp21 are access transistors, Qn11 and Qn21 are driver transistors, and Qa1 and Qb1 are memory nodes for storing data. The access transistors Qp11 and Qp21 have functions of accessing the memory cell and charging memory nodes to "H." The driver transistors Qn11 and Qn21 drive the memory nodes to read and write memory cell data.

Figure 2:
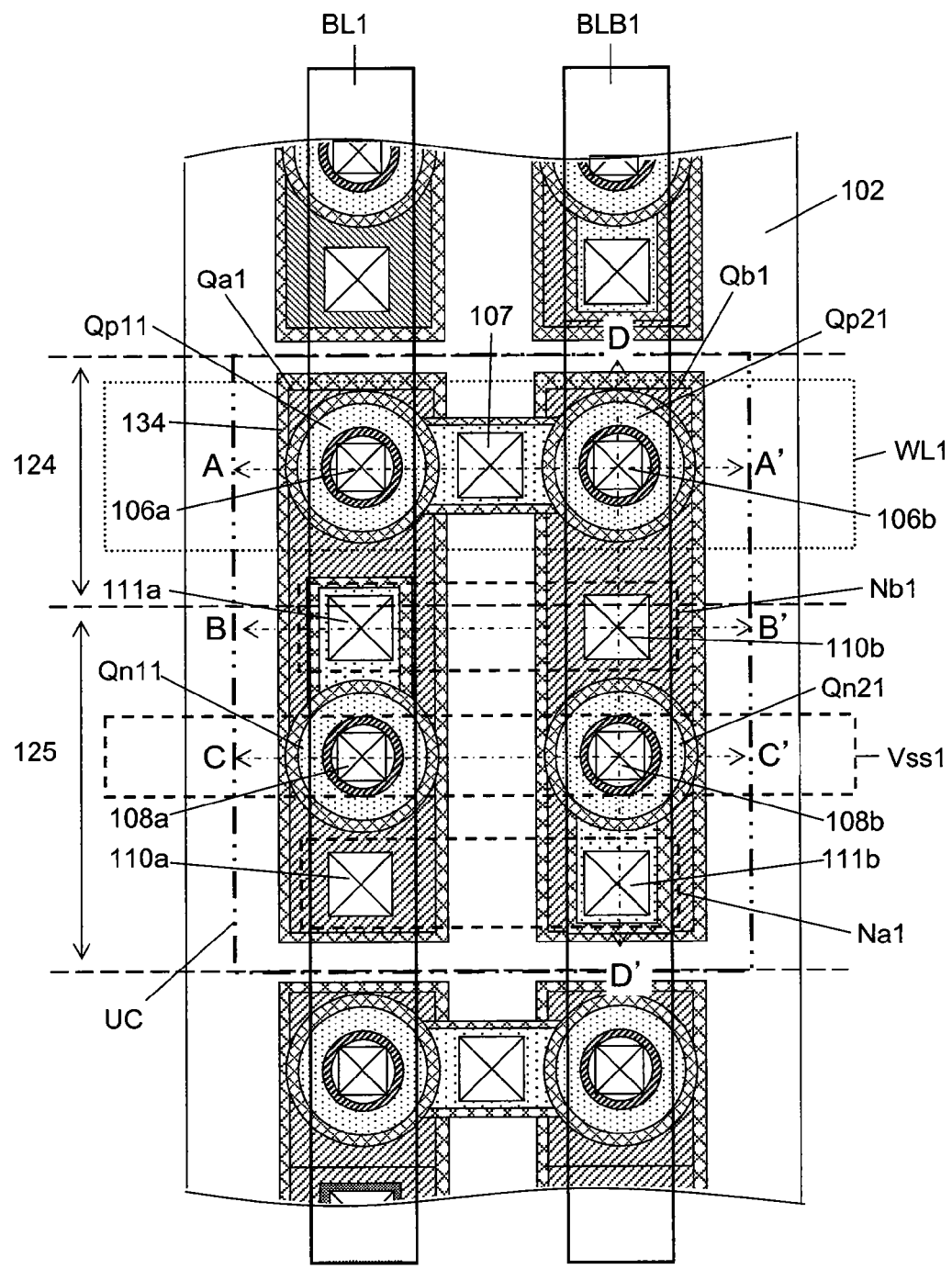
FIG. 2 is a plane view of the SRAM according to Embodiment 1 of the present invention.

FIG. 2 is a plane view of an SRAM in Embodiment 1 of the present invention. A unit cell UC shown in FIG. 2 is repeatedly arranged in an SRAM cell array. FIGS. 3A to 3D show cross-sectional structures at the section lines A-A', B-B', C-C', and D-D' in the layout of FIG. 2.

First, the layout of this embodiment will be described with reference to FIGS. 2 and 3A to 3D. An n– well or a first well 101a is formed on a substrate within an SRAM cell array. Diffusion layers on the substrate are separated by an element separator 102. A first memory node Qa1 formed by diffusion layers on the substrate is formed by a first p+ diffusion layer 103a and a first n+ diffusion layer 104a and is connected by a first silicide layer 113a formed on the substrate surface. Similarly, a second memory node Qb1 formed by diffusion layers on the substrate is formed by a second p+ diffusion layer 103b and a second n+ diffusion layer 104b and is connected by a second silicide layer 113b formed on the substrate surface.

In order to prevent leak from the first n+ diffusion layer 104a having the same conductivity type as the n– well or the first well 101a to the substrate, a first anti-leak diffusion layer 101b or second anti-leak diffusion layer 101c consisting of a p+ diffusion layer is formed between the first well 101a and first n+ diffusion layer 104a. The first anti-leak diffusion layer 101*b* and second anti-leak diffusion layer 101*c* are each separated by the element separator 102 in each diffusion layer on the substrate.

Qp11 and Qp21 are PMOS access transistors for accessing the memory cell. Qn11 and Qn21 are NMOS driver transistors for driving the memory cell.

In this embodiment, one unit cell UC comprises transistors arranged in two rows and two columns on the substrate. Arranged in the first column, the access transistor Qp11 and driver transistor Qn11 are provided on the first memory node Qa1 in this order from the top in the figure. Arranged in the second column, the access transistor Qp21 and driver transistor Qn21 are provided on the second memory node Qb in this order from the top in the figure. The SRAM cell array of this embodiment is constructed by successively arranging the unit cells UC having such four transistors in the vertical direction in the figure.

A contact 110*a* formed on the first memory node Qa1 is connected to a contact 111*b* formed on a gate wire extending from the gate electrode of the driver transistor Qn21 by a node connection wire Na1. A contact 110*b* formed on the second memory node Qb1 is connected to a contact 111*a* formed on a gate wire extending from the gate electrode of the driver transistor Qn11 by a node connection wire Nb1. A contact 106*a* formed in the upper part of the access transistor Qp11 is connected to the bit line BL1. A contact 106*b* formed in the upper part of the access transistor Qp21 is connected to the bit line BLB1. A common contact 107 formed on a gate wire extending from the gate electrodes of the access transistor Qp11 and access transistor Qp21 is connected to the word line WL1. Here, it is possible that the gate wire extending from the gate electrode of an access transistor Qp11 or Qp21 is shared with an adjoining cell in the crosswise direction and a contact on the gate wire is formed between the adjoining cells.

Contacts (108*a*, 108*b*) formed in the upper parts of the driver transistors (Qn11, Qn21) are connected to the ground potential wiring layer Vss1. It is desirable that the word line, bit lines, and ground potential wire are connected in a layer above the node connection wires or intra-memory cell wires so as to be shared with the other memory cells.

In a realizable configuration of the above hierarchical wiring, the node connection wire (Na1), node connection wire (Nb1), and ground potential wire (Vss1) are provided in a layer below the bit lines (BL1, BLB1) and the word line (WL1) is provided in a layer above the bit lines (BL1, BLB1) so that undesired contact between the wires and contacts does not occur.

FIG. 2 shows an n+ injection region 125 and a p+ injection region 124. In the SRAM cell array region of this embodiment, the pattern for forming the n+ injection region 125 and p+ injection region 124 consists of simple lines and spaces. Therefore, there is very little influence of dimensional variations and misalignment. The dimensional margin around the boundary between the n+ and p+ injection regions 124 and 125 is minimized. In the figure, the vertical length of the SRAM cell (the length in the connection direction of SRAM cells) is effectively reduced.

Furthermore, in this embodiment, the memory nodes Qa1 and Qb1 and gate wires shown in the layout of FIG. 2 are all rectangular in shape. Therefore, the pattern can easily be corrected in shape by OPC (optical proximity correction), which is suitable for attaining a small SRAM cell area.

In the present invention, the source and drain of each transistor composing the SRAM are defined as follows. For the driver transistors (Qn11, Qn21), a diffusion layer formed in the upper part of a columnar semiconductor layer connected to a ground voltage is defined as the source diffusion layer and a diffusion layer formed in the lower part of the columnar semiconductor layer is defined as the drain diffusion layer. For the access transistors (Qp11, Qp21), diffusion layers formed in the upper and lower parts of a columnar semiconductor layer serve either as a source or as a drain depending on the operation state. Here, the diffusion layer formed in the upper part of a columnar semiconductor layer is defined as the source diffusion layer and the diffusion layer formed in the lower part of the columnar semiconductor layer is defined as the drain diffusion layer for convenience.

Figure 3A:
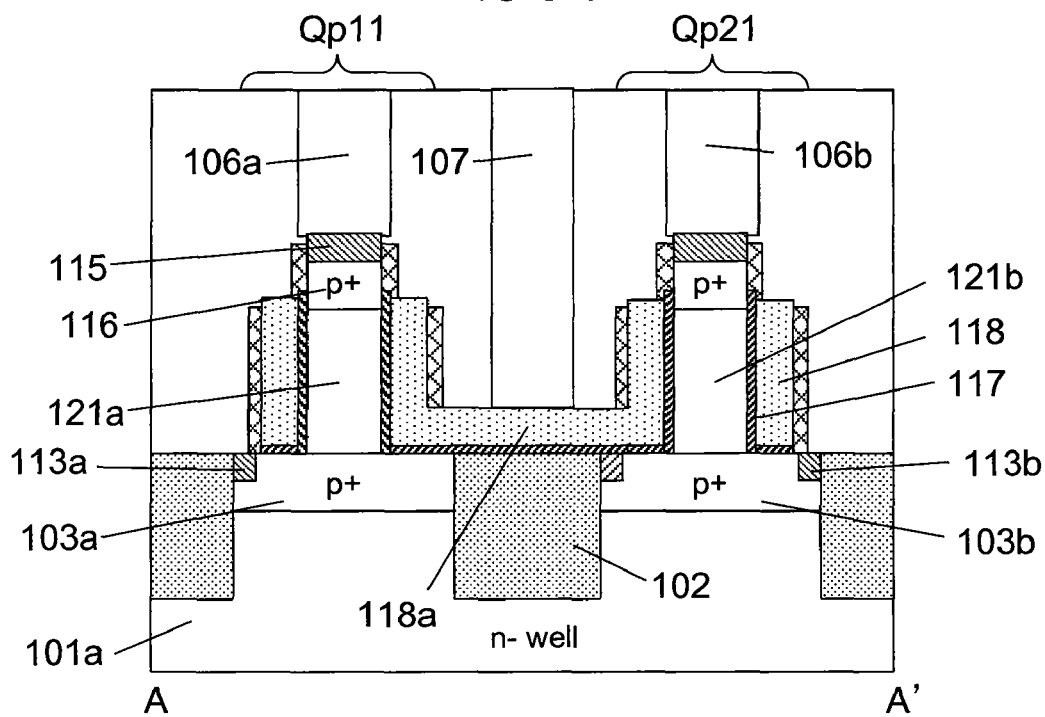
FIG. 3A is a cross-sectional view of the SRAM according to Embodiment 1 of the present invention.

The SRAM structure of the present invention will be described hereafter with reference to the cross-sectional structures in FIGS. 3A to 3D. As shown in FIG. 3A, an n− well or a first well 101*a* shared in an SRAM cell array is formed in a substrate and diffusion layers on the substrate are separated by an element separator 102. A first p+ drain diffusion layer 103*a* is formed for the first memory node Qa1 formed by diffusion layers on the substrate by impurity implantation. A second p+ drain diffusion layer 103*b* is formed for the second memory node Qb1 formed by diffusion layers on the substrate by impurity implantation. Furthermore, first and second silicide layers (113*a*, 113*b*) are formed on the first and second p+ drain diffusion layers (103*a*, 103*b*), respectively. A columnar silicon layer 121*a* composing the access transistor Qp11 is formed on the first p+ drain diffusion layer 103*a* and a columnar silicon layer 121*b* composing the access transistor Qp21 is formed on the second p+ drain diffusion layer 103*b*.

A gate insulating film 117 and a gate electrode 118 are formed around each columnar silicon layer. A p+ source diffusion layer 116 is formed in the upper part of the columnar silicon layer by impurity implantation and a silicide layer 115 is formed on the surface of the source diffusion layer. A contact 106*a* formed on the access transistor Qp11 is connected to the bit line BL1 and a contact 106*b* formed on the access transistor Qp21 is connected to the bit line BLB1. A contact 107 formed on a gate wire 118*a* extending from the gates of the access transistors Qp11 and Qp21 is connected to the word line WL1.

Figure 3B:
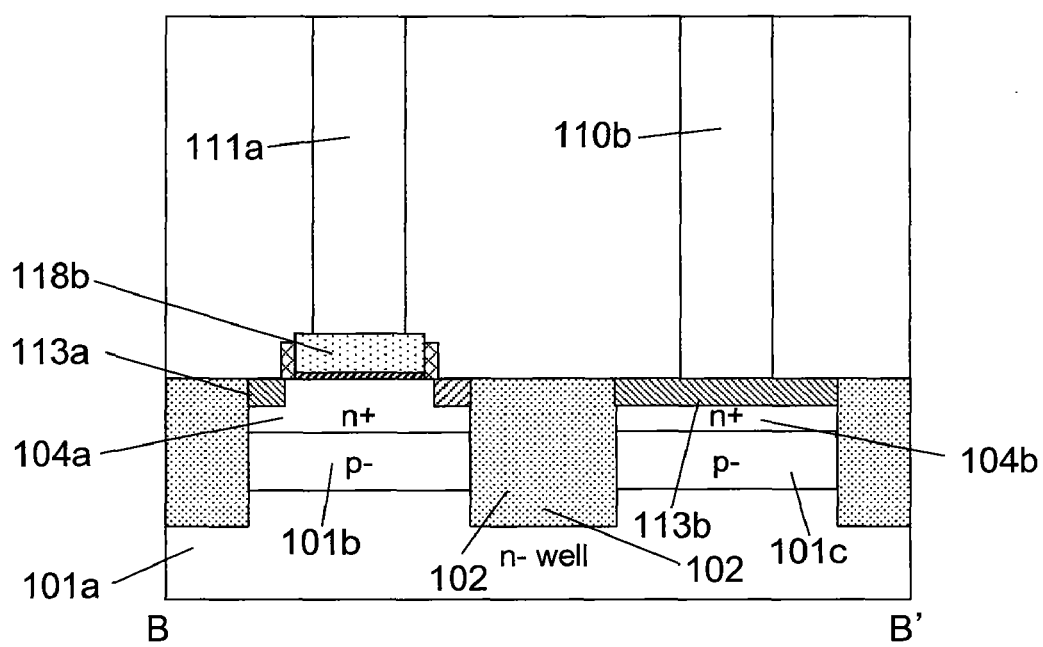
FIG. 3B is a cross-sectional view of the SRAM according to Embodiment 1 of the present invention.

As shown in FIG. 3B, the n− well or the first well 101*a* shared in the SRAM cell array is formed in the substrate and the diffusion layers on the substrate are separated by the element separator 102. A first n+ drain diffusion layer 104*a* is formed for the first memory node Qa1 formed by diffusion layers on the substrate by impurity implantation and a second n+ drain diffusion layer 104*b* is formed for the second memory node Qb1 formed by diffusion layers on the substrate by impurity implantation. Furthermore, the first and second silicide layers (113*a*, 113*b*) are formed on the first and second n+ drain diffusion layers (104*a*, 104*b*), respectively. A contact 111*a* formed on the first n+ drain diffusion layer 104*a* is formed on around the boundary area between the first p+ drain diffusion layer 103*a* and first n+ drain diffusion layer 104*a* and connected to a contact 111*a* formed on a gate wire 118*b* extending from the gate electrode of the driver transistor Qn1 via a memory node connection wire Na1.

In order to prevent leak from the first n+ drain diffusion layer 104*a* having the same conductivity type as the first well 101*a* to the substrate, a first anti-leak diffusion layer 101*b* consisting of a p+ diffusion layer is formed between the first well 101*a* and first n+ drain diffusion layer 104*a*. In order to prevent leak from the second n+ drain diffusion layer 104*b* having the same conductivity type as the first well 101*a* to the substrate, a second anti-leak diffusion layer 101*c* consisting of a p+ diffusion layer is formed between the first well 101*a* and second n+ drain diffusion layer 104*b*.

Figure 3C:
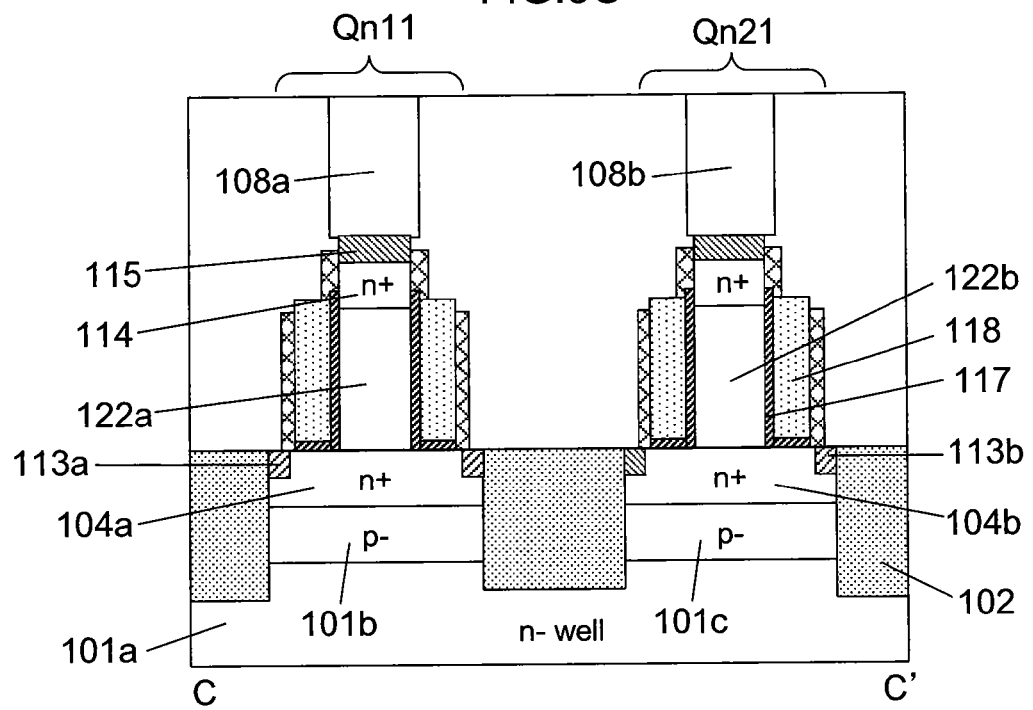
FIG. 3C is a cross-sectional view of the SRAM according to Embodiment 1 of the present invention.

As shown in FIG. 3C, the n− well or the first well 101*a* shared in the SRAM cell array is formed in the substrate and the diffusion layers on the substrate are separated by the element separator 102. The first n+ drain diffusion layer 104a is formed for the first node Qa1 formed by diffusion layers on the substrate by impurity implantation and the second n+ drain diffusion layer 104b is formed for the second memory node Qb1 formed by diffusion layers on the substrate by impurity implantation. Furthermore, the first and second silicide layers (113a, 113b) are formed on the surfaces of the first and second n+ drain diffusion layers (104a, 104b), respectively. The first anti-leak diffusion layer 101b consisting of a p+ diffusion layer is formed between the first well 101a and first n+ drain diffusion layer 104a. Furthermore, in order to prevent leak from the second n+ drain diffusion layer 104b having the same conductivity type as the first well 101a to the substrate, the second anti-leak diffusion layer 101c consisting of a p+ diffusion layer is formed between the first well 101a and second n+ diffusion layer 104b.

A columnar silicon layer 122a forming the driver transistor Qn11 is formed on the first n+ drain diffusion layer 104a and a columnar silicon layer 122b forming the driver transistor Qn21 is formed on the second n+ drain diffusion layer 104b. A gate insulating film 117 and a gate electrode 118 are formed around each columnar silicon layer. An n+ source diffusion layer 114 is formed in the upper part of the columnar silicon layer by impurity implantation and a silicide layer 115 is formed on the surface of the source diffusion layer. Both contacts (108a, 108b) formed on the driver transistors (Qn11, Qn21) are connected to the ground potential Vss1 via a wiring layer.

Figure 3D:
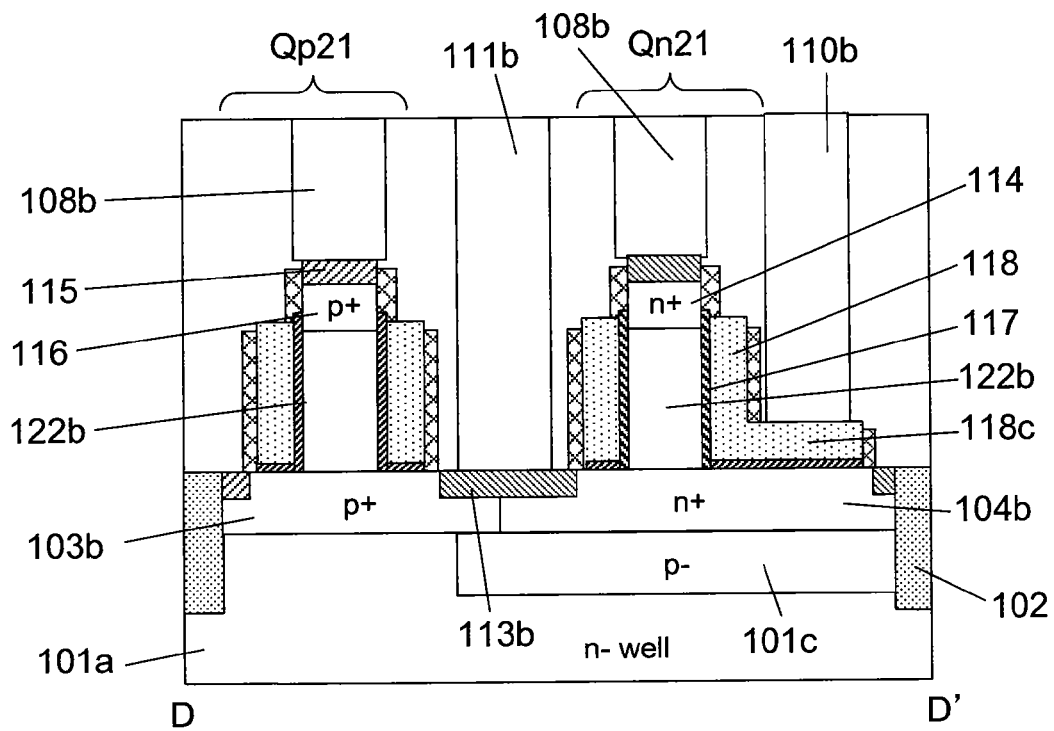
FIG. 3D is a cross-sectional view of the SRAM according to Embodiment 1 of the present invention.
Figure 4A:
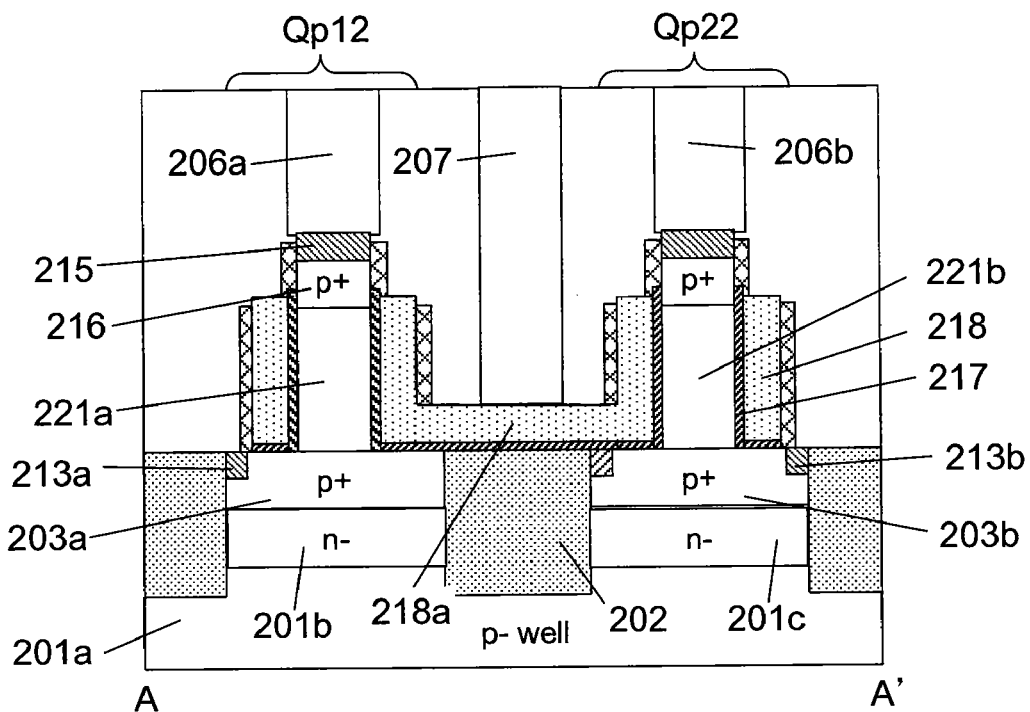
FIG. 4A is a cross-sectional view of another SRAM according to Embodiment 1 of the present invention.
Figure 4B:
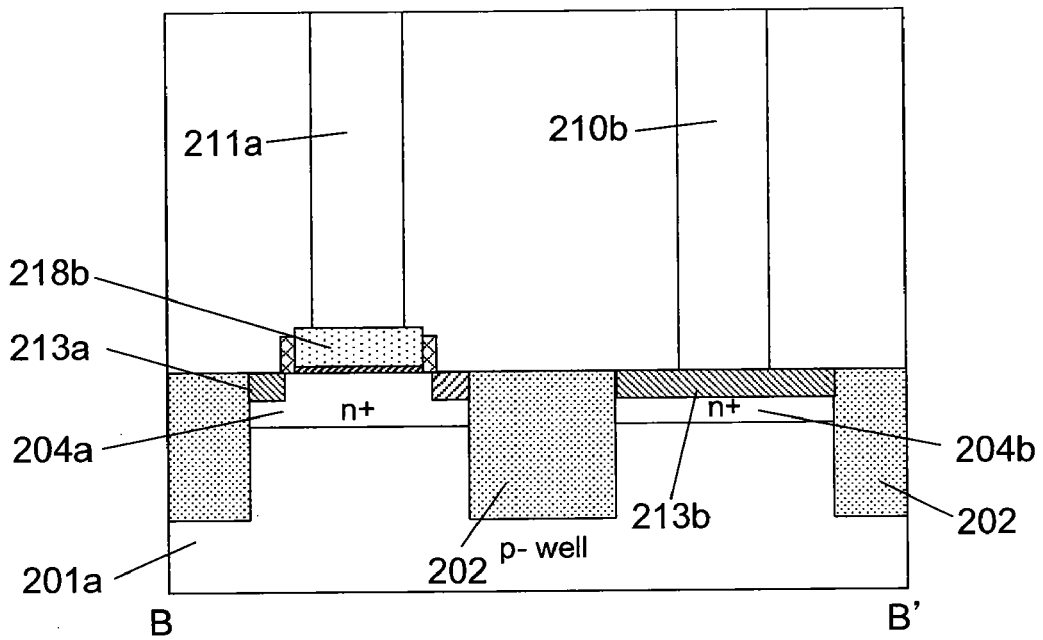
FIG. 4B is a cross-sectional view of another SRAM according to Embodiment 1 of the present invention.
Figure 4C:
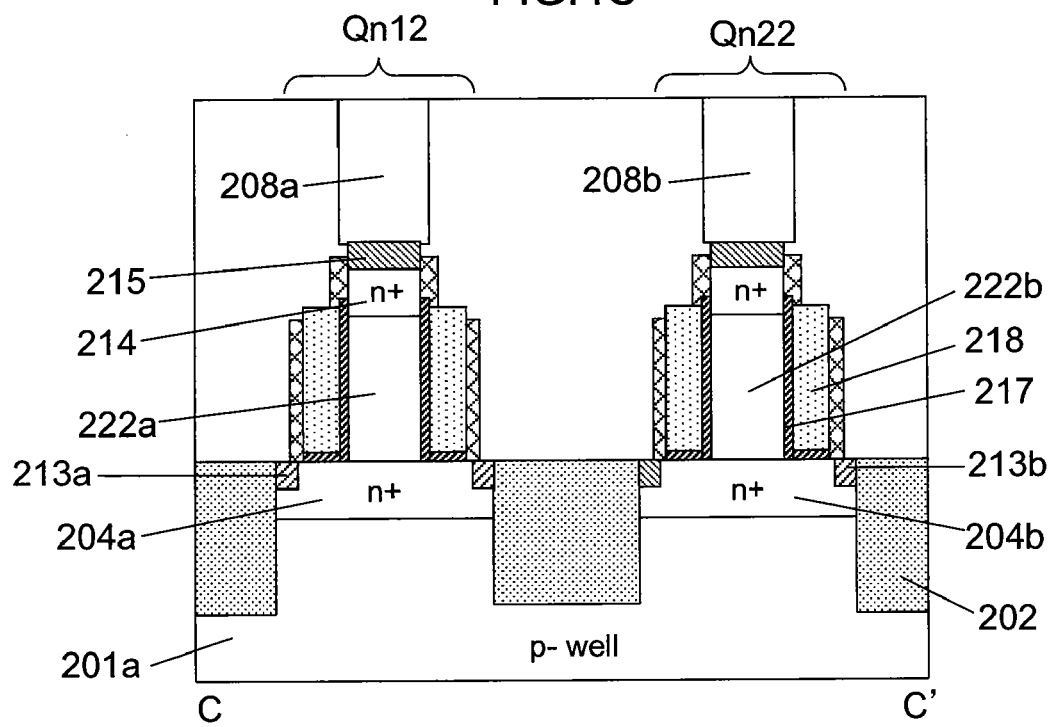
FIG. 4C is a cross-sectional view of another SRAM according to Embodiment 1 of the present invention.
Figure 4D:
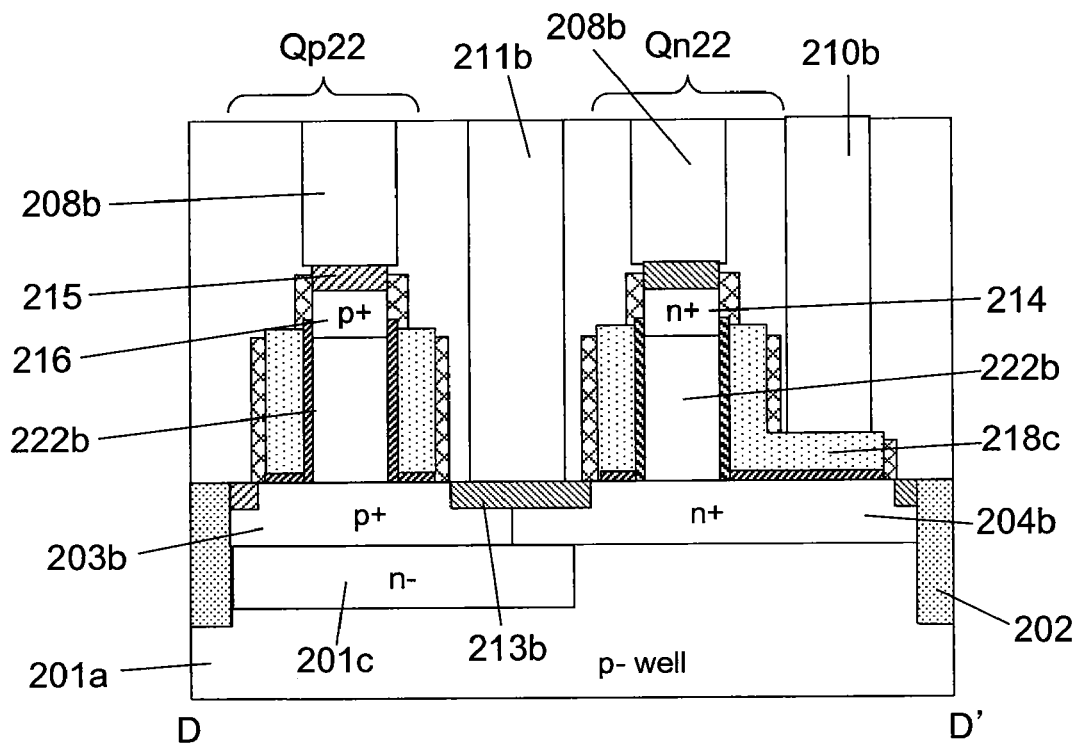
FIG. 4D is a cross-sectional view of another SRAM according to Embodiment 1 of the present invention.

As shown in FIG. 3D, the n− well or the first well 101a shared in the SRAM cell array is formed in the substrate and the diffusion layers on the substrate are separated by the element separator 102. A second p+ drain diffusion layer 103b and a second n+ drain diffusion layer 104b are formed for the second memory node Qb formed by diffusion layers on the substrate by impurity implantation. A second silicide layer 113b is formed on the drain diffusion layer. The second p+ drain diffusion layer 103b and second n+ drain diffusion layer 104b are directly connected by the second silicide layer 113b. Therefore, there is no need of forming an element separator separating the n+ drain diffusion layer from the p+ drain diffusion layer or a contact connecting the n+ drain diffusion layer to the p+ drain diffusion layer. Then, the memory cell area can be reduced. In order to prevent leak from the second n+ diffusion layer 104b having the same conductivity type as the first well 101a to the substrate, the second anti-leak diffusion layer 101c consisting of a p+ diffusion layer is formed between the first well 101a and second n+ drain diffusion layer 104b.

A columnar silicon layer 122b composing the access transistor Qp21 is formed on the second p+ drain diffusion layer 103b and a columnar silicon layer 122b composing the driver transistor Qn21 is formed on the second n+ drain diffusion layer 104b. A gate insulating film 117 and a gate electrode 118 are formed around each of the p and n columnar silicon layers. A source diffusion layer is formed in the upper part of each columnar silicon layer by impurity implantation. A silicide layer 115 is formed on the surface of the source diffusion layer. A contact 108b formed on the access transistor Qp21 is connected to the bit line BLB1 and a contact 108b formed on the driver transistor Qn21 is connected to the ground potential Vss1.

A contact 110b is formed on a gate wire 118c extending from the gate electrode of the driver transistor Qn21. The contact 110b is connected to a contact 111a formed on the first n+ drain diffusion layer 104a via a memory node connection wire Na1. A contact 111b is formed on the second n+ drain diffusion layer 104b. The contact 111b is connected to a contact 111a formed on a gate wire 118b extending from the gate electrode of the driver transistor Qn11 via a memory node connection wire Nb1.

As described above, in the present invention, the n+ drain diffusion layer and p+ drain diffusion layer forming the memory nodes (Qa1, Qb1) are directly connected by a silicide layer, whereby the access transistor and driver transistor share a drain diffusion layer and function as a memory node of an SRAM. Therefore, there is no need of forming an element separator separating the n+ drain diffusion layer from the p+ drain diffusion layer. Only the element separator separating two memory nodes of an SRAM is necessary, attaining a small SRAM cell area.

As shown in FIGS. 4A to 4D, an SRAM cell having a structure in which a first well 201a is a p− well and a first and second anti-leak diffusion layers 201b and 201c consisting of n+ diffusion layers are formed between an n+ diffusion layer and the substrate can similarly be formed. In such a case, the first anti-leak diffusion layer 201b is formed between a p+ drain diffusion layer 203a and the first well 201a and the second anti-leak diffusion layer 201c is formed between a p+ drain diffusion layer 203b and the first well 201a so as to prevent leak from the diffusion layer to the substrate.

An example of a method of producing the semiconductor memory device of the present invention will be described hereafter with reference to FIGS. 5A to 13B. In each figure, A is a plane view and B is a cross-sectional view at a line D-D' in A.

Figure 5A:
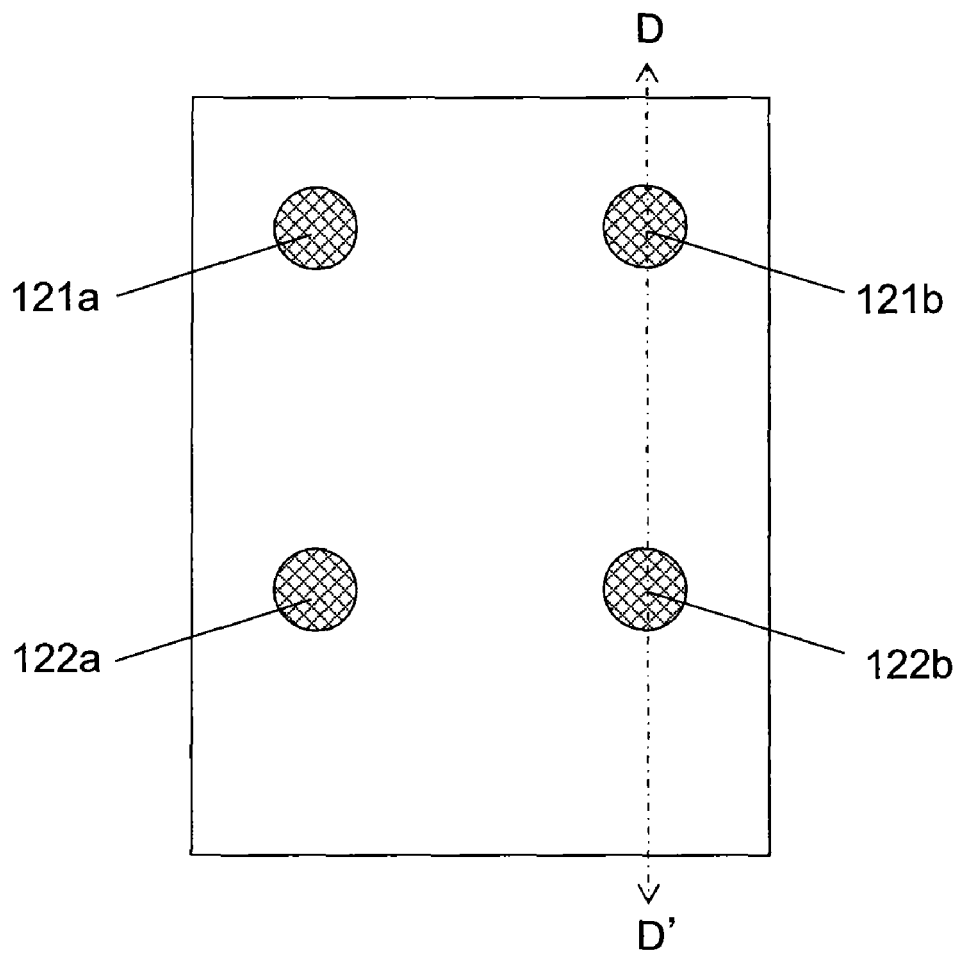
FIG. 5A is a plane view showing a production step (1) of the SRAM according to Embodiment 1 of the present invention.
Figure 5B:
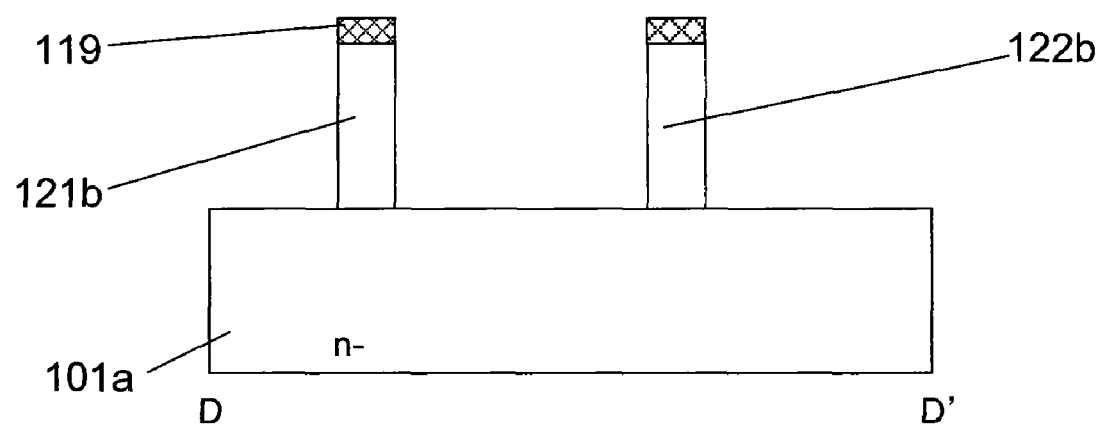
FIG. 5B is a cross-sectional view showing the production step (1) of the SRAM according to Embodiment 1 of the present invention.

As shown in FIGS. 5A and 5B, a silicon nitride film or the like is formed on a substrate, a pattern for columnar silicon layers (121a, 122a, 121b, 122b) is formed by lithography, and etching is performed to form a silicon nitride film mask 119 and columnar silicon layers (121a, 122a, 121b, 122b). Subsequently, an n− well or a first well 101a is formed in an SRAM cell array by impurity implantation.

Figure 6A:
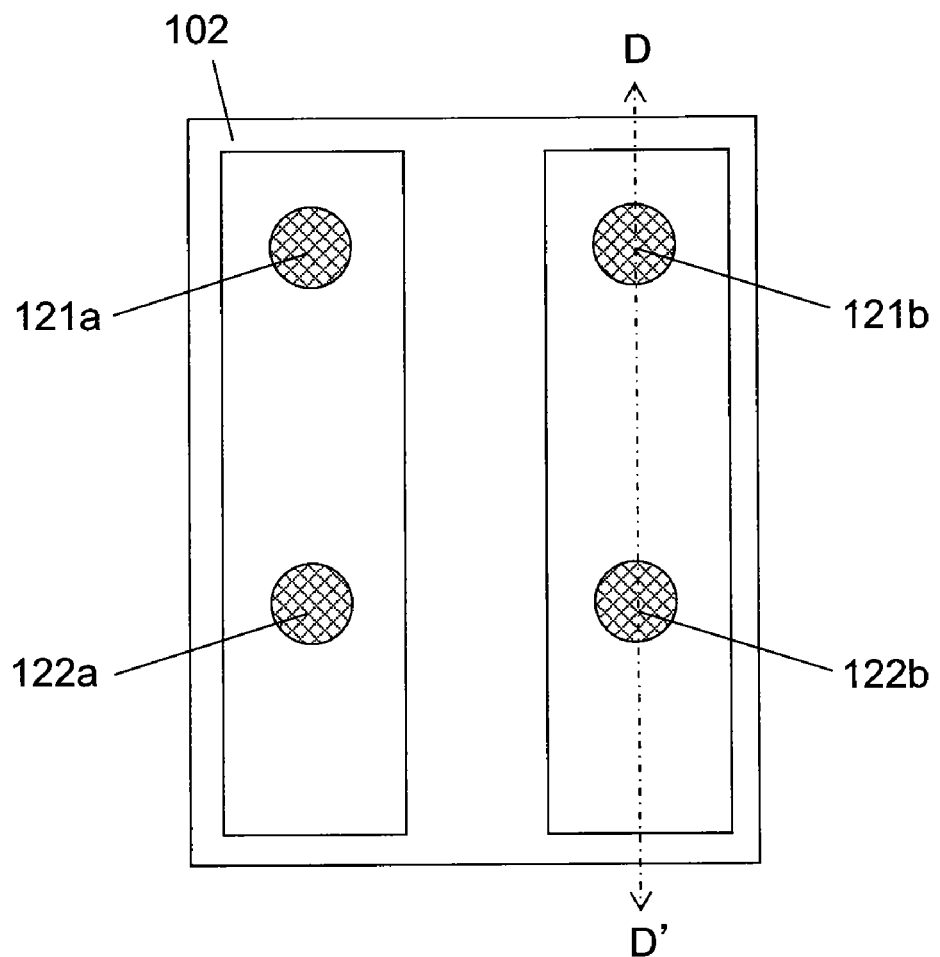
FIG. 6A is a plane view showing a production step (2) of the SRAM according to Embodiment 1 of the present invention.
Figure 6B:
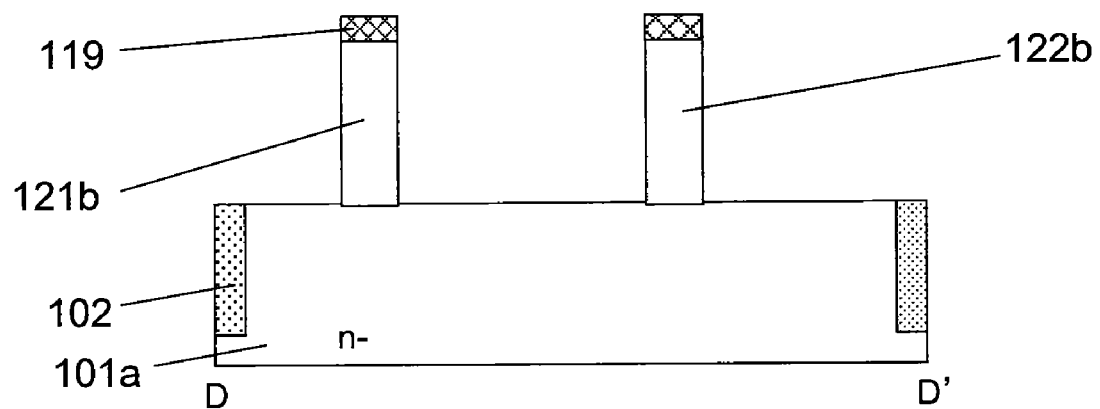
FIG. 6B is a cross-sectional view showing the production step (2) of the SRAM according to Embodiment 1 of the present invention.

As shown in FIGS. 6A and 6B, an element separator 102 is formed. The element separator is formed by first etching a groove pattern, filling the groove pattern with an oxide film by CVD or the like, and removing any extra oxide film on the substrate by dry or wet etching. Consequently, a diffusion layer pattern composing a first memory node Qa1 and a second memory node Qb1 is formed on the substrate.

Figure 7A:
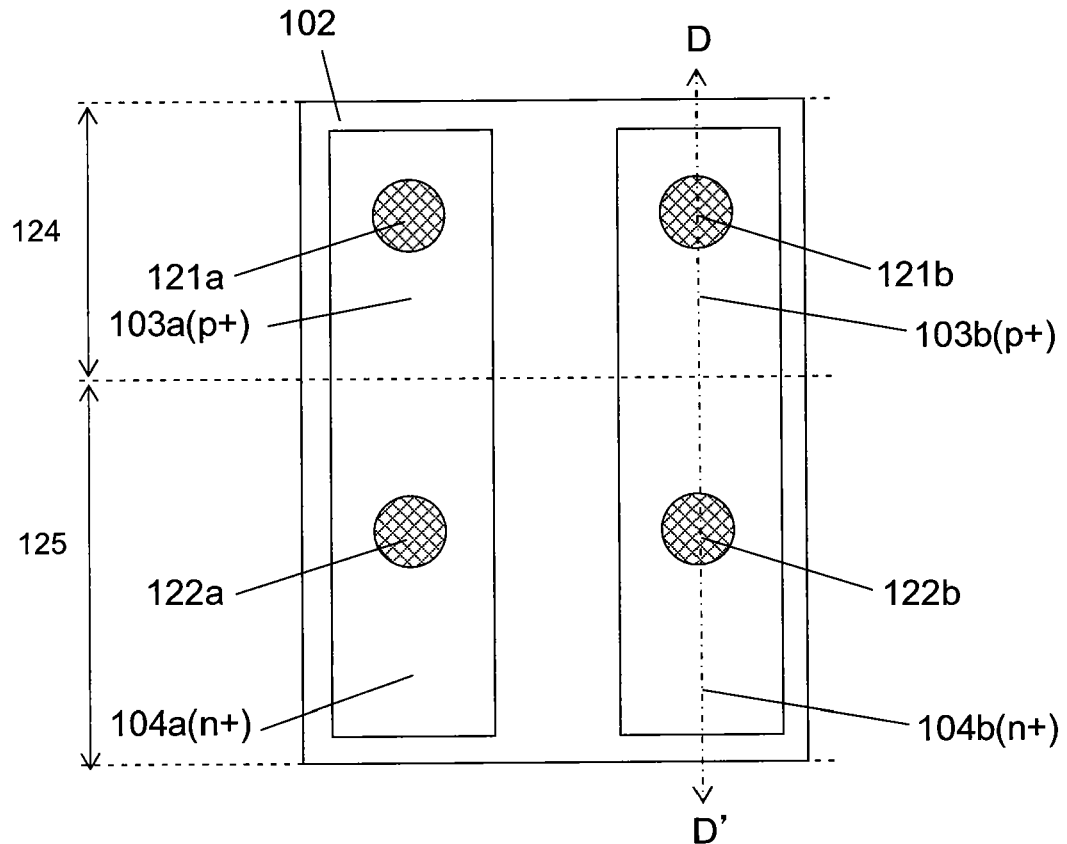
FIG. 7A is a plane view showing a production step (3) of the SRAM according to Embodiment 1 of the present invention.
Figure 7B:
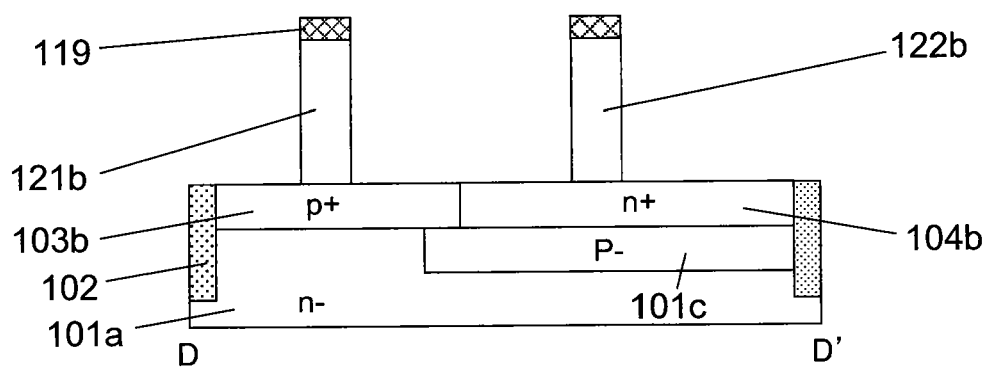
FIG. 7B is a cross-sectional view showing the production step (3) of the SRAM according to Embodiment 1 of the present invention.

As shown in FIGS. 7A and 7B, impurities are introduced in a p+ injection region 124 and an n+ injection region 125, respectively, by ion implantation to form drain diffusion layers (103a, 103b, 104a, 104b) in the lower parts of the columnar silicon layers on the substrate. In order to prevent leak from the n+ drain diffusion layer 104b having the same conductivity type as the n− well or the first well 101a to the substrate, a second anti-leak diffusion layer 101c or a p+ diffusion layer is formed. The second anti-leak diffusion layer 101c can be formed by impurity implantation using a mask for the n+ injection region 125.

Figure 8A:
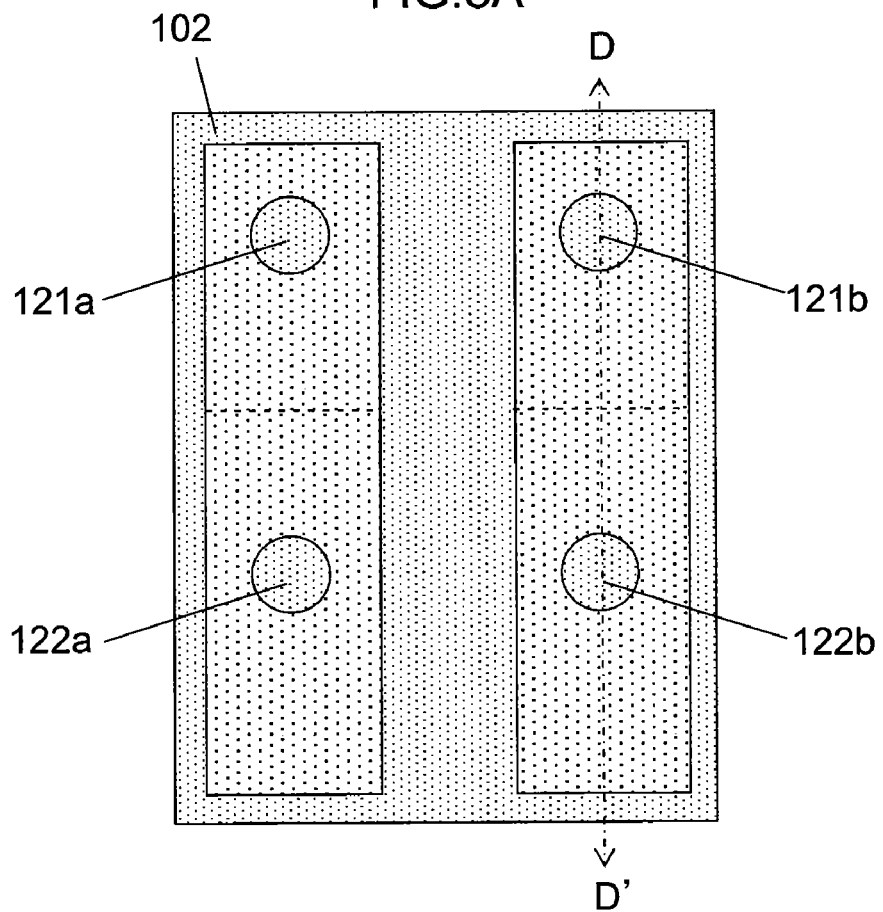
FIG. 8A is a plane view showing a production step (4) of the SRAM according to Embodiment 1 of the present invention.
Figure 8B:
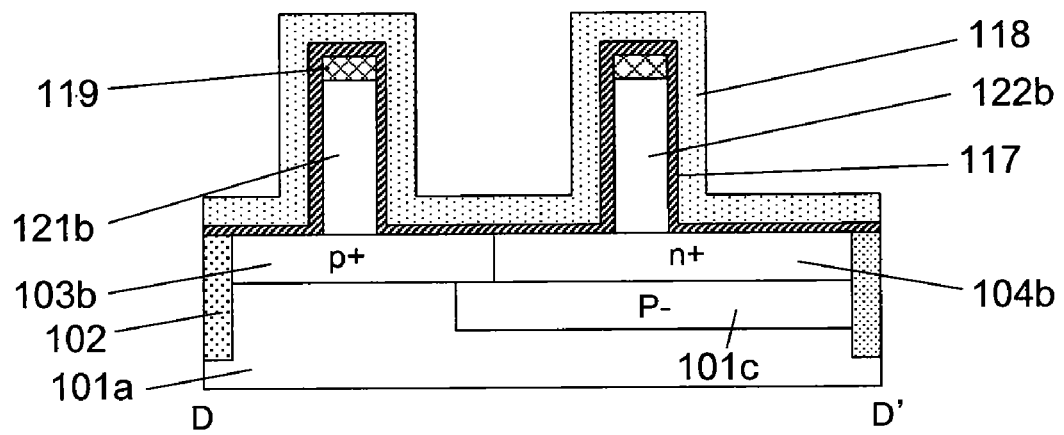
FIG. 8B is a cross-sectional view showing the production step (4) of the SRAM according to Embodiment 1 of the present invention.

As shown in FIGS. 8A and 8B, a gate insulating film 117 and a gate conductive film 118 are formed. The gate insulating film 117 is formed by an oxide film or High-k film. The gate conductive film 118 is formed by a polysilicon or metal film.

Figure 9A:
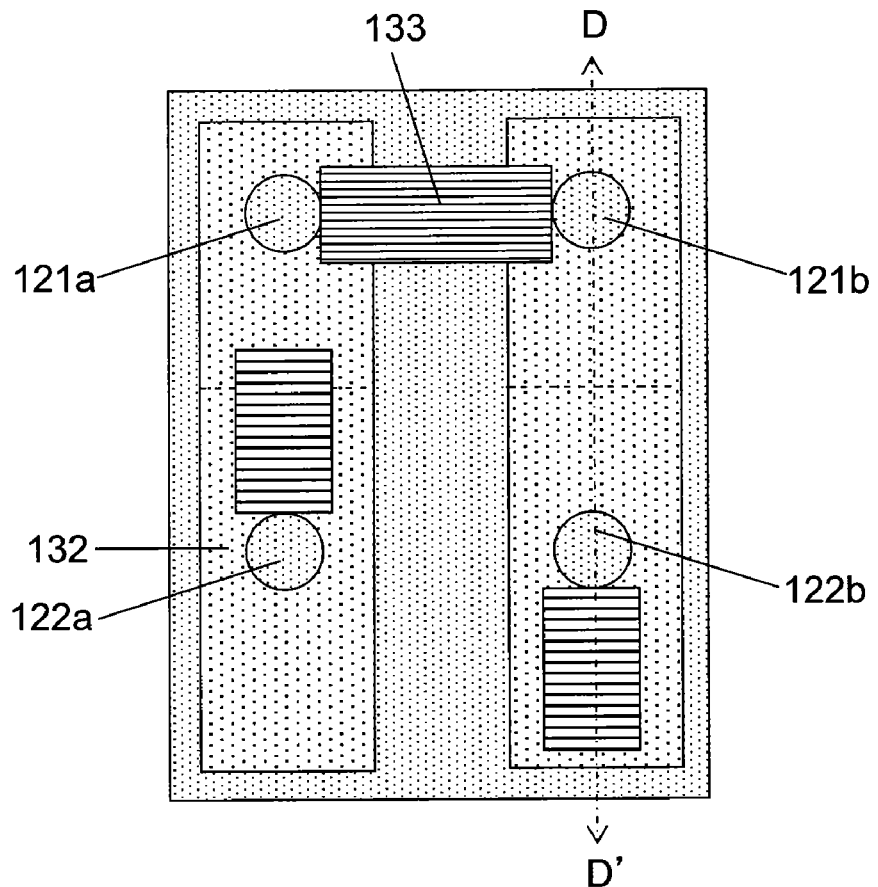
FIG. 9A is a plane view showing a production step (5) of the SRAM according to Embodiment 1 of the present invention.
Figure 9B:
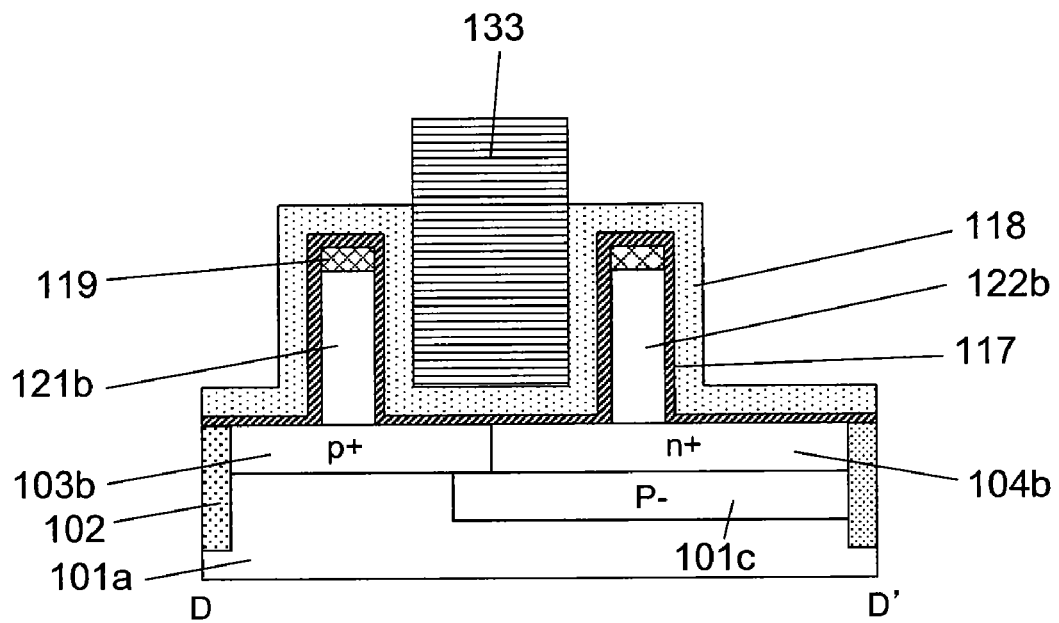
FIG. 9B is a cross-sectional view showing the production step (5) of the SRAM according to Embodiment 1 of the present invention.

As shown in FIGS. 9A and 9B, a gate wire pattern is formed by lithography using a resist 133.

Figure 10A:
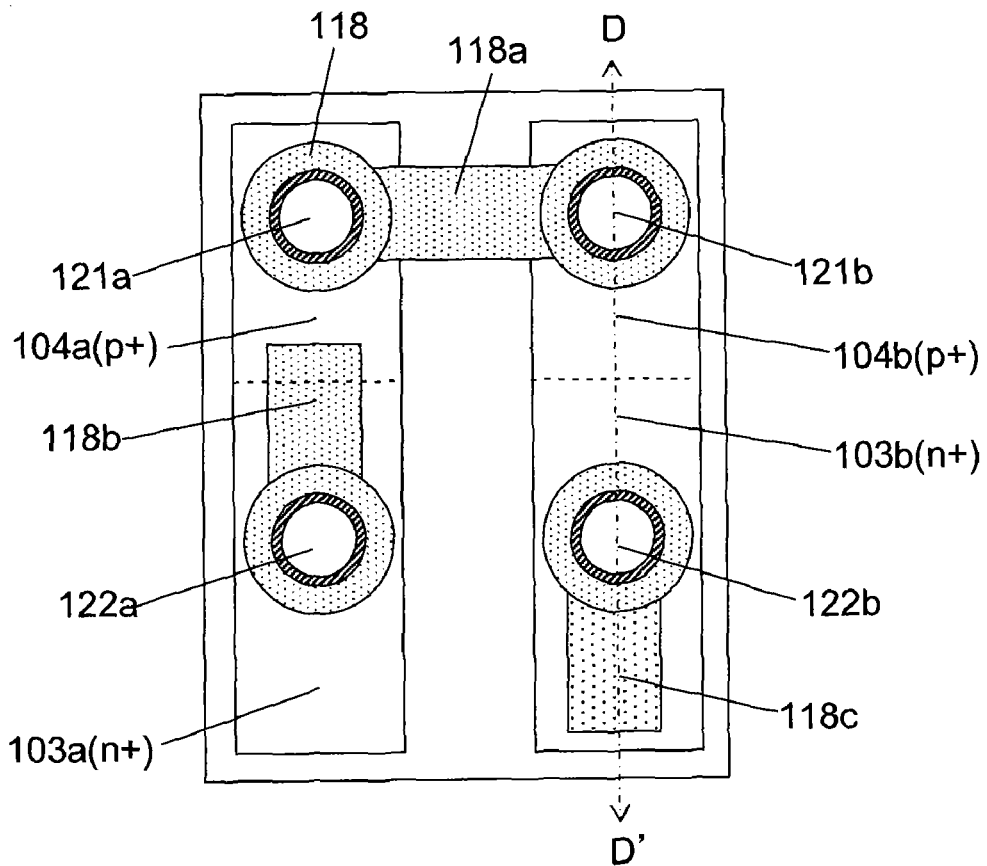
FIG. 10A is a plane view showing a production step (6) of the SRAM according to Embodiment 1 of the present invention.
Figure 10B:
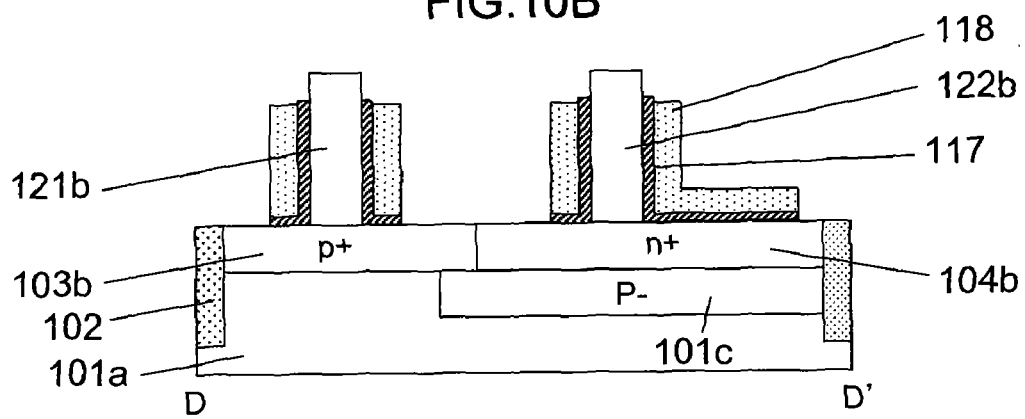
FIG. 10B is a cross-sectional view showing the production step (6) of the SRAM according to Embodiment 1 of the present invention.

As shown in FIGS. 10A and 10B, the gate conductive film 117 and gate insulating film 118 are etched using the resist 133 as a mask and the resist 133 is removed. Then, gate wires (118a to 118c) are formed. Then, a mask 119 on the pillars is removed.

Figure 11A:
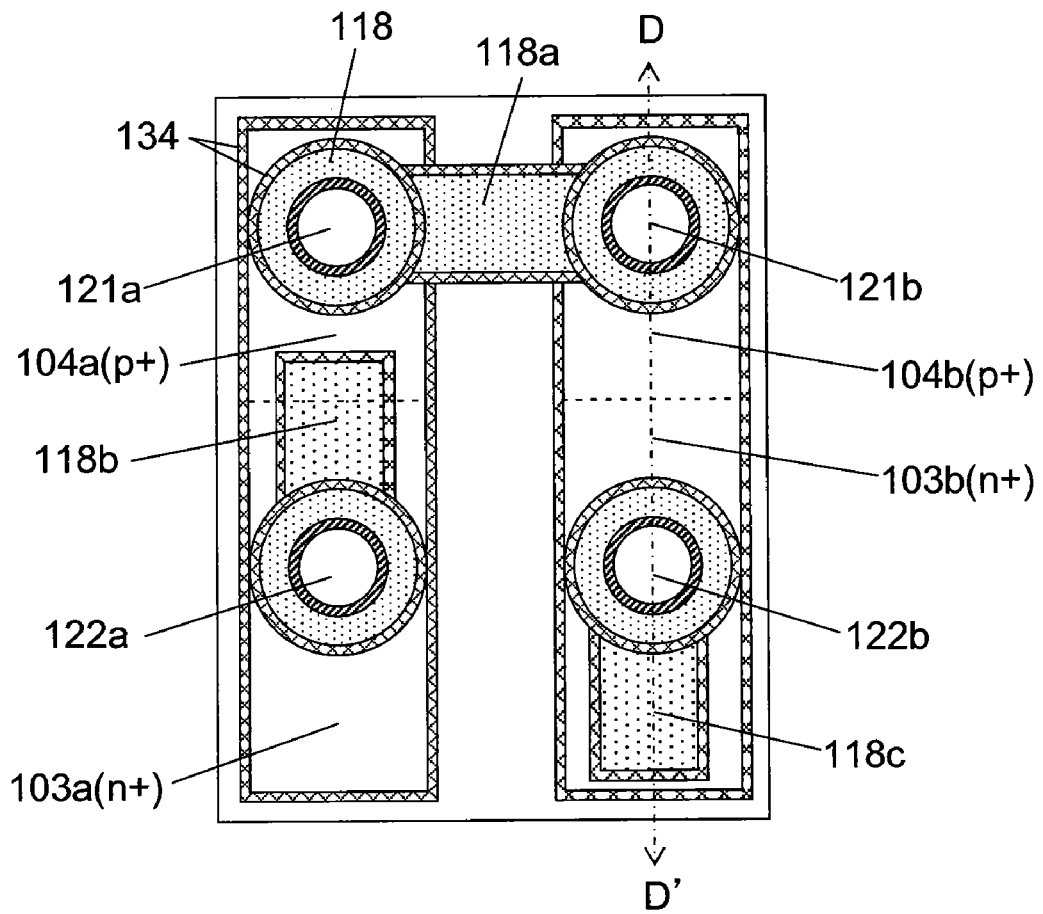
FIG. 11A is a plane view showing a production step (7) of the SRAM according to Embodiment 1 of the present invention.
Figure 11B:
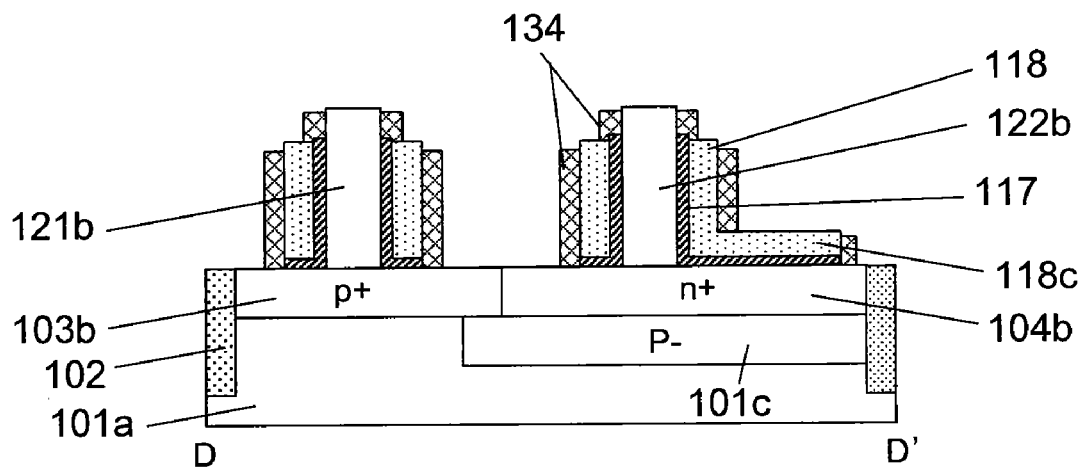
FIG. 11B is a cross-sectional view showing the production step (7) of the SRAM according to Embodiment 1 of the present invention.

As shown in FIGS. 11A and 11B, an insulating film such as a silicon nitride film is formed and etched back so that an insulating film 134 such as a silicon nitride film covers the sidewalls of columnar silicon layers and the sidewalls of gate electrodes.

Figure 12A:
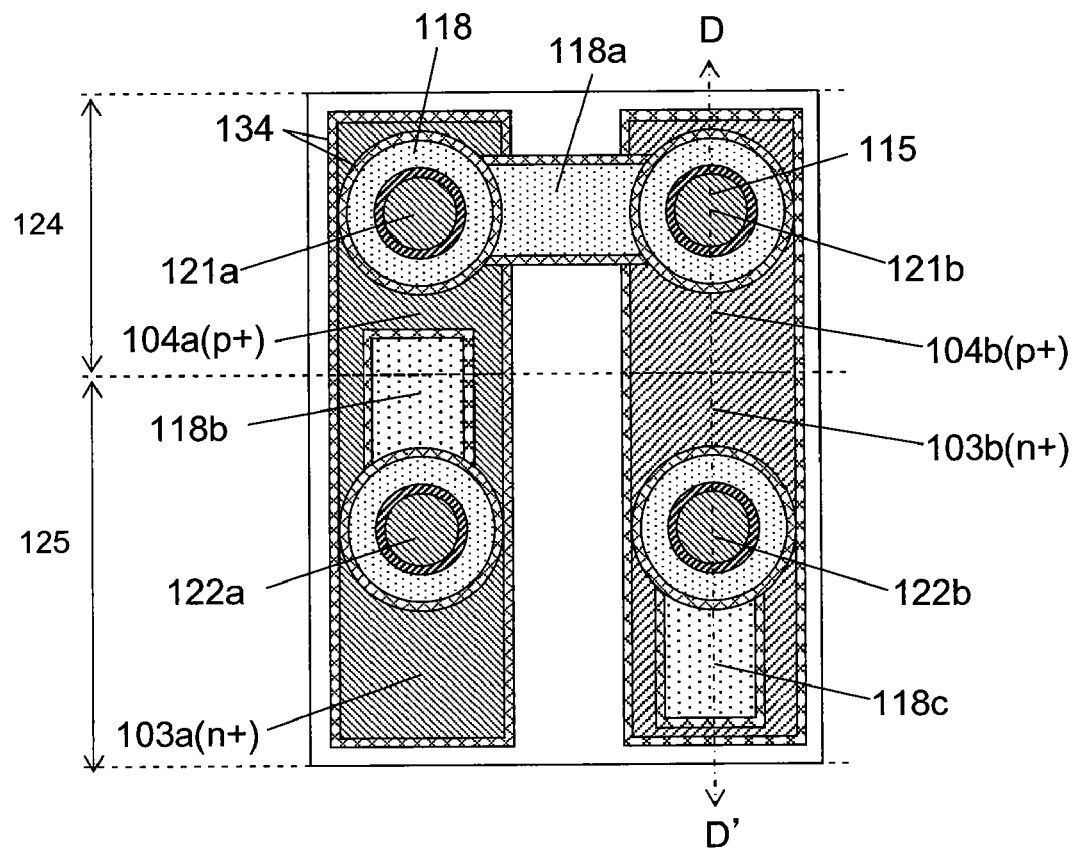
FIG. 12A is a plane view showing a production step (8) of the SRAM according to Embodiment 1 of the present invention.
Figure 12B:
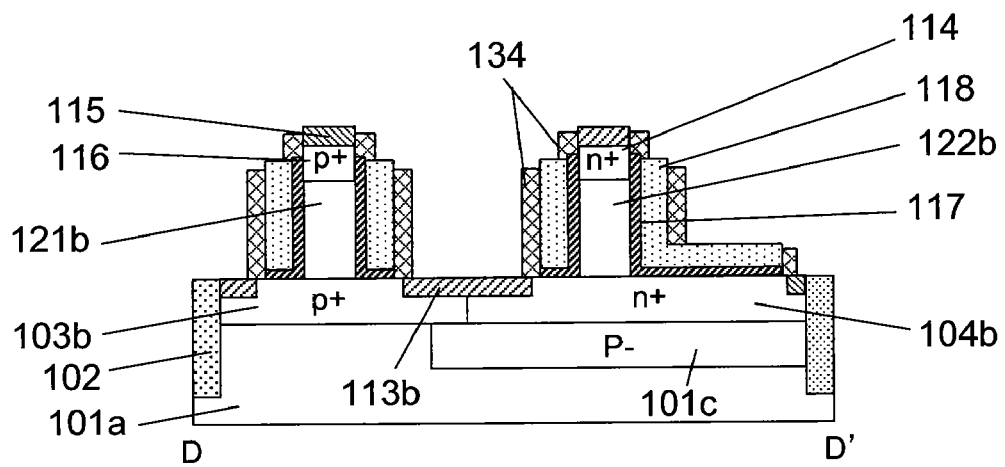
FIG. 12B is a cross-sectional view showing the production step (8) of the SRAM according to Embodiment 1 of the present invention.

As shown in FIGS. 12A and 12B, impurities are introduced in the p+ injection region 124 and n+ injection region 125, respectively, by ion implantation to form source diffusion layers (114, 116) in the upper parts of the columnar silicon layers. Subsequently, silicide layers (113a, 113b) on the drain diffusion layers and a silicide layer 115 on the source diffusion layers in the upper parts of the columnar silicon layers are formed by sputtering of a metal such as Ni and heat treatment.

Here, the insulating film 134 such as a silicon nitride film covering the sidewalls of the columnar silicon layers and gate electrodes prevents any drain-gate or source-gate short-circuit which may occur due to the silicide layer.

Figure 13A:
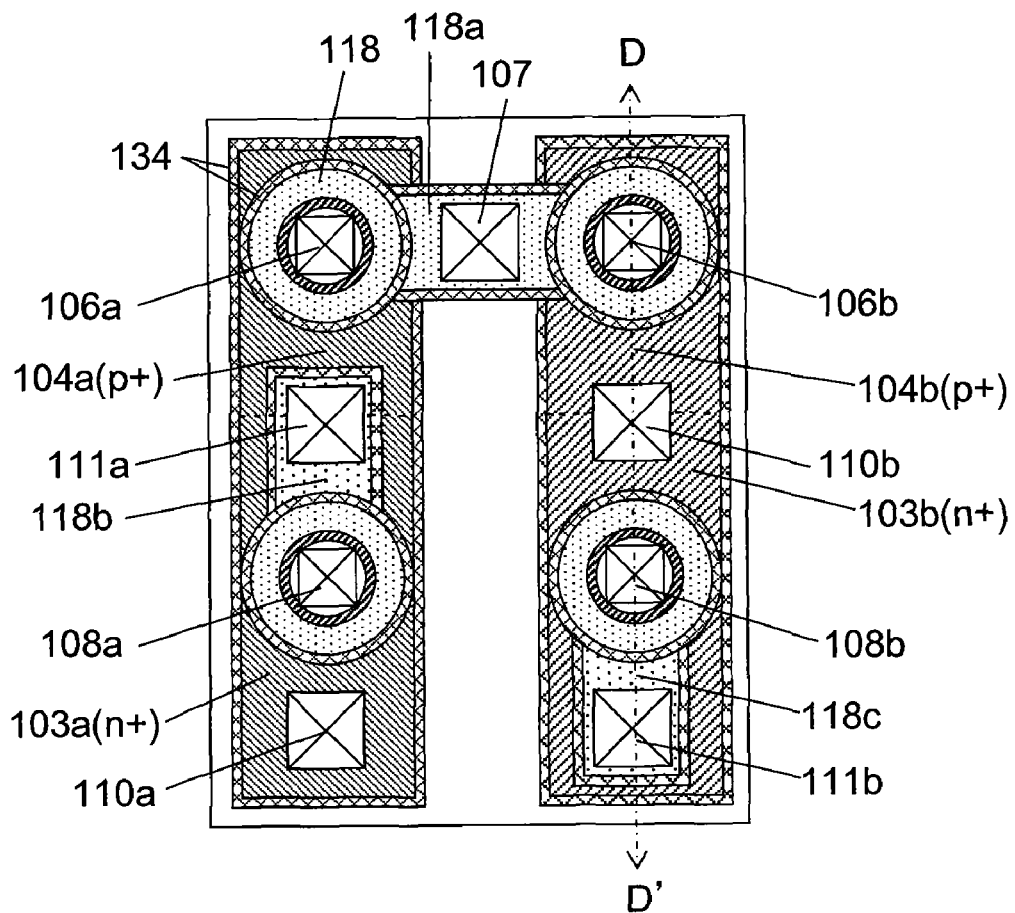
FIG. 13A is a plane view showing a production step (9) of the SRAM according to Embodiment 1 of the present invention.
Figure 13B:
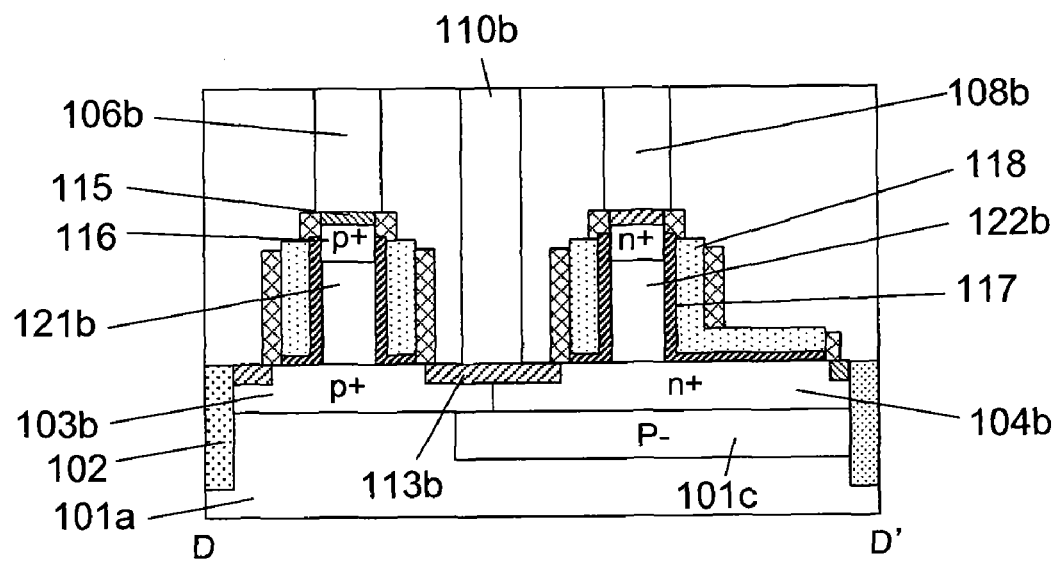
FIG. 13B is a cross-sectional view showing the production step (9) of the SRAM according to Embodiment 1 of the present invention.

As shown in FIGS. 13A and 13B, contacts (106a to 111a, 106b to 111b) are formed after a silicon oxide film or an interlayer film is formed.

The SRAM cell of the present invention has limitation on layout at many points because of the minimum distance between contacts. Therefore, the contacts on the columnar silicon layers are formed in the first lithography and etching and the contacts on the diffusion layers and gates are formed in the second lithography and etching. In this way, the minimum distance between the contacts on the columnar silicon layers and the contacts on the diffusion layers and gates can be reduced, whereby further reducing the SRAM cell area. Here, the contacts on the gates can be formed in the same step as the contacts on the columnar silicon layers.

Embodiment 2

Figure 14:
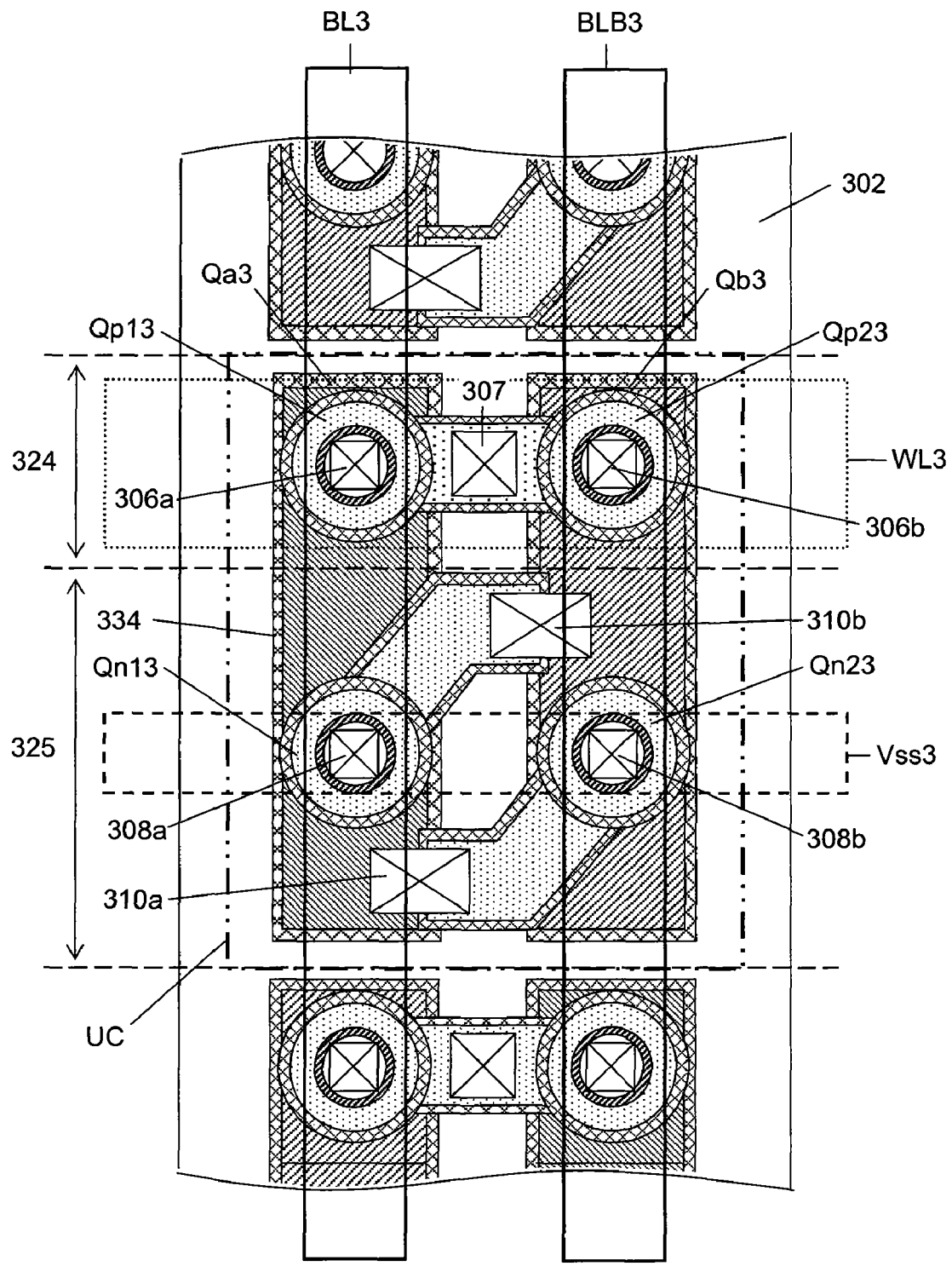
FIG. 14 is a plane view of an SRAM according to Embodiment 2 of the present invention.

FIG. 14 is a plane view of the SRAM of Embodiment 2 of the present invention. This embodiment is different from Embodiment 1 in the following point. In Embodiment 2, the memory node Qa3 formed by the first diffusion layer on the substrate and the gate wire extending from the gate electrode of the driver transistor Qn23 are connected by a common contact 310a extending over them. Furthermore, the memory node Qb3 formed by the second diffusion layer on the substrate and the gate wire extending from the gate electrode of the driver transistor Qn13 are connected by a common contact 310b extending over them.

The gate and memory node are connected by a contact, not by a wiring layer, as described above; the number of contacts in an SRAM cell can be reduced. The cell area can be reduced by adjusting the positions of columnar silicon layers and contacts.

As mentioned in Embodiment 1, the word line, bit lines, and ground potential wire are desirably provided in a layer above the node connection wires or intra-memory cell wires so as to be shared with the other memory cells. In this embodiment, the node connection wires are formed by contacts. Except for this point, the same structure as in Embodiment 1 is employed and further explanation is omitted.

Embodiment 3

Figure 15:
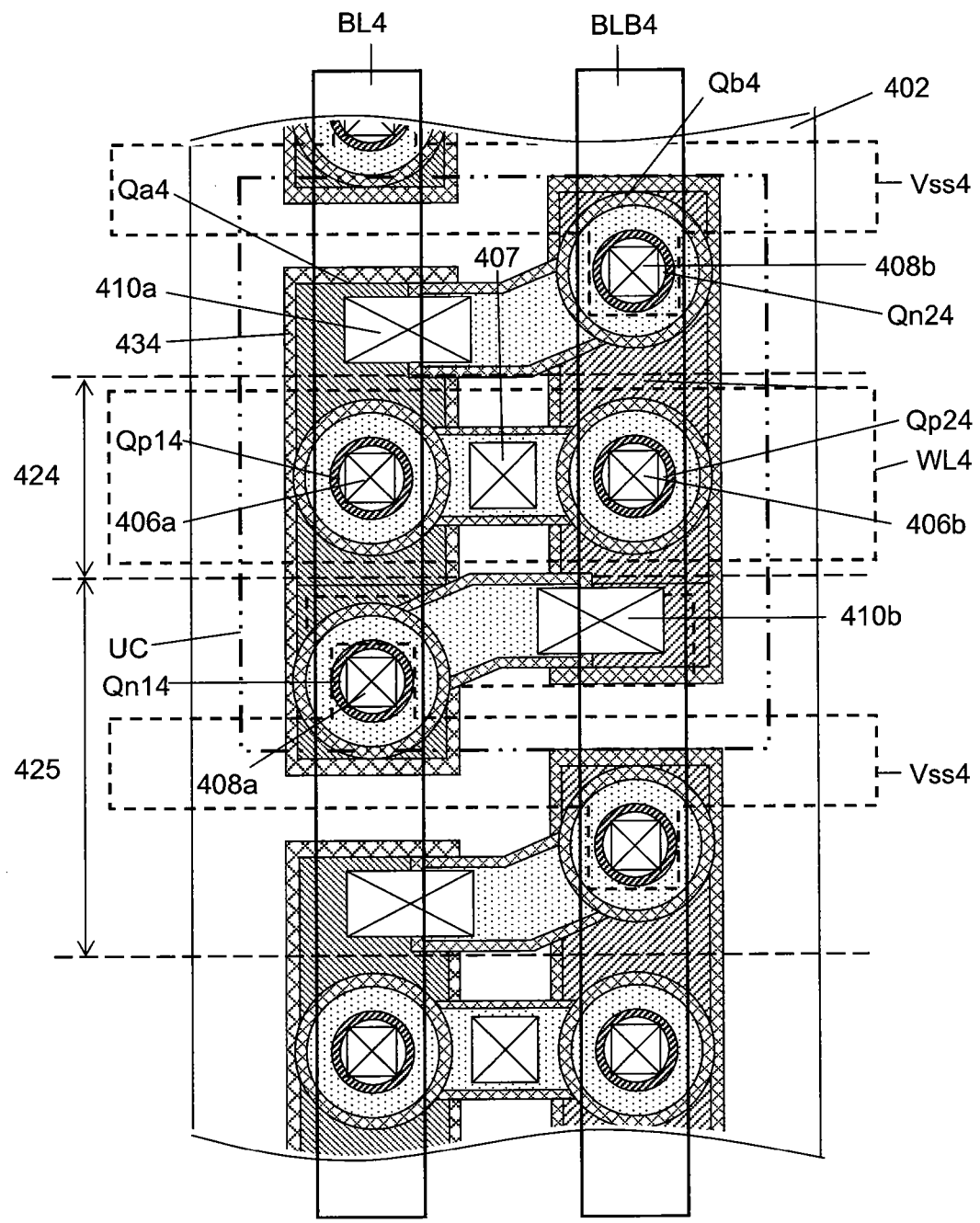
FIG. 15 is a plane view of an SRAM according to Embodiment 3 of the present invention.

FIG. 15 is a plane view of the SRAM of Embodiment 3 of the present invention. This embodiment is different from Embodiments 1 and 2 in the following point. In Embodiments 1 and 2, the contact (110a, 210a) adjoins only the driver transistor (Qn11, Qn12) on the memory node Qa while the contact (110b, 210b) are provided on the diffusion layer between the driver transistor (Qn21, Qn22) and access transistor (Qp21, Qp22) on the memory node Qb.

This asymmetric layout causes asymmetry in characteristics of the SRAM cell and may narrow the operational margin.

In this embodiment, a vertically (longitudinally) and horizontally (laterally) symmetric layout is employed. Therefore, deterioration in the operational margin due to the above asymmetry does not occur, attaining an SRAM cell having a broad operational margin.

Furthermore, as in Embodiment 2, a memory node Qa4 formed by the first diffusion layer on the substrate and the gate wire extending from the gate electrode of a driver transistor Qn24 are connected by a common contact 410a extending over them. A memory node Qb4 formed by the second diffusion layer on the substrate and the gate wire extending from the gate electrode of a driver transistor Qn14 are connected by a common contact 410b extending over them.

The word line, bit lines, and ground potential wire are desirably provided in a layer above the node connection wires or intra-memory cell wires so as to be shared with the other memory cells. In this embodiment, the node connection wires are formed by contacts.

By way of example in a realizable configuration of the above hierarchical wiring, a ground potential wire Vss4 and a word line WL4 are provided in the same layer and bit lines (BL4, BLB4) are provided in a layer above the word line WL4 so that undesired contact between the wires and contacts does not occur.

Embodiment 4

Figure 16:
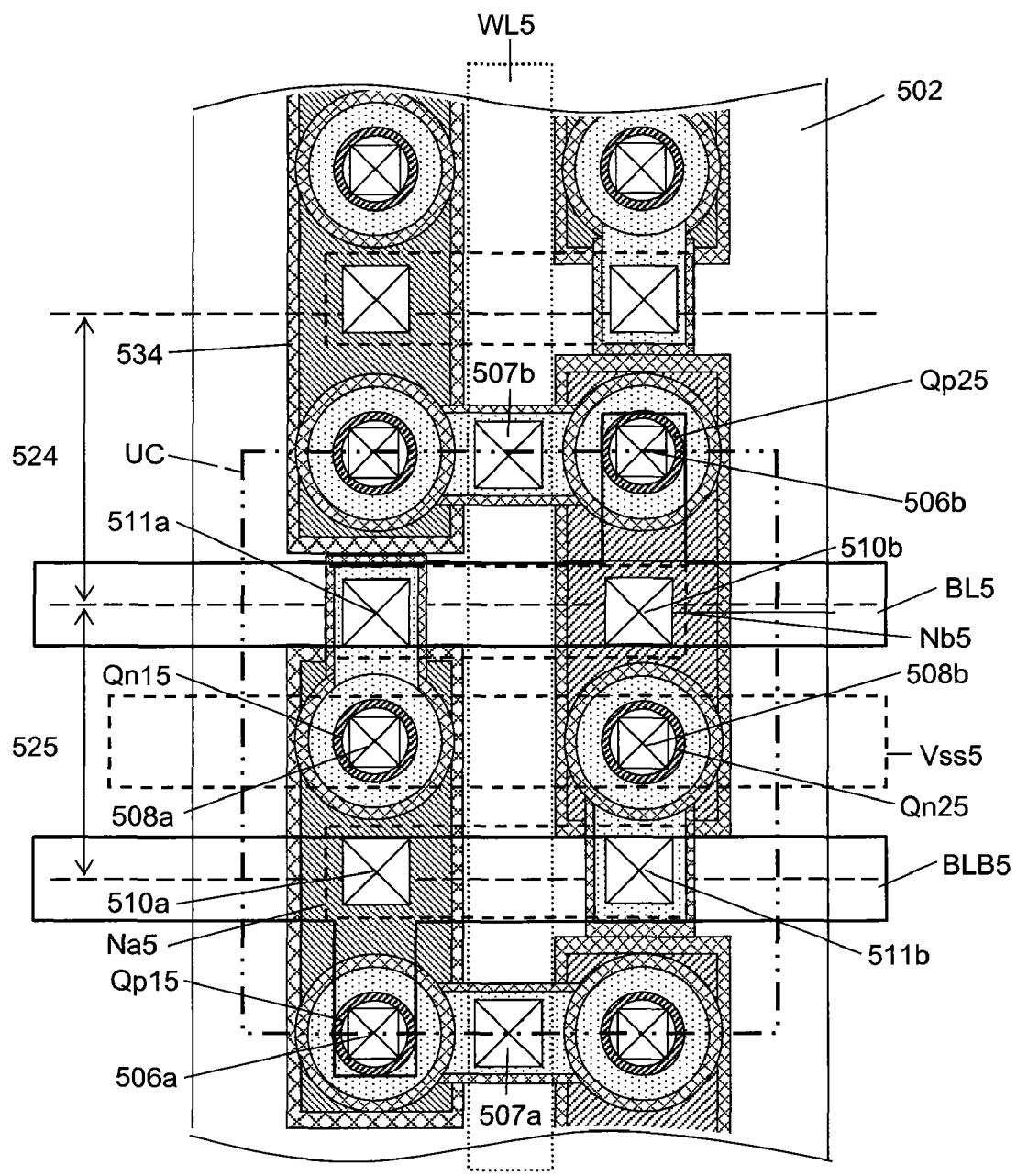
FIG. 16 is a plane view of an SRAM according to Embodiment 4 of the present invention.

FIG. 16 is a plane view of the SRAM of Embodiment 4 of the present invention. In this embodiment, a vertically (longitudinally) and horizontally (laterally) symmetric layout is used as in Embodiment 3 and, therefore, the above problems due to asymmetry do not occur. Then, an SRAM cell having a broader operational margin can be attained. The word line, bit lines, and ground potential wire are desirably provided in a layer above the node connection wires or intra-memory cell wires so as to be shared with the other memory cells.

By way of example in a realizable configuration of the above hierarchical wiring, a node connection wire (Na5), node connection wire (Nb5), and ground potential wire (Vss5) are provided in a lower layer than a word line (WL5), and bit lines (BL5, BLB5) are provided in an upper layer than the word line (WL5) so that undesired contact between the wires and contacts does not occur.

Embodiment 5

Figure 17:
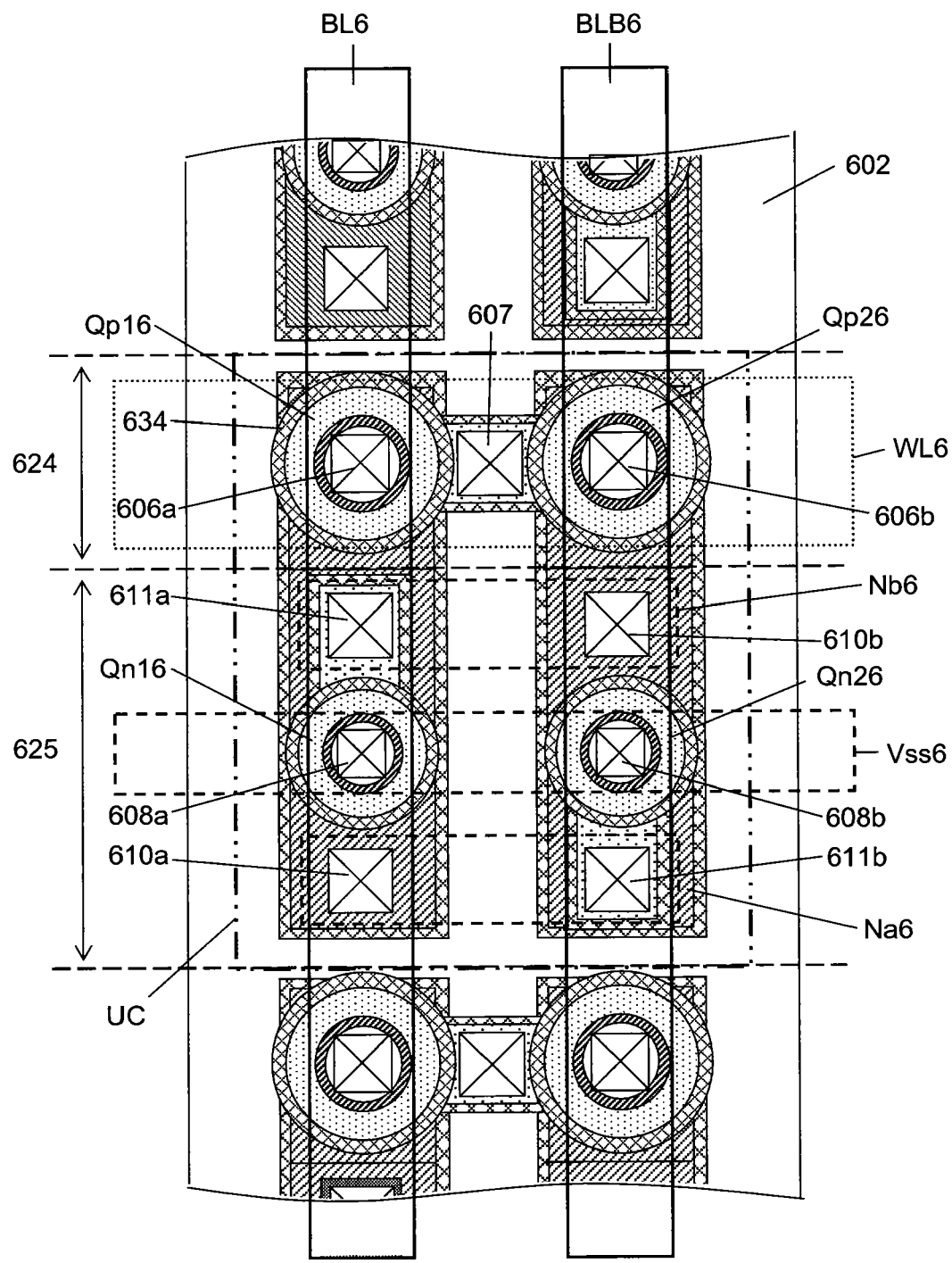
FIG. 17 is a plane view of an SRAM according to Embodiment 5 of the present invention.

FIG. 17 is a plane view of the SRAM of Embodiment 5 of the present invention. This embodiment is different from Embodiment 1 in that the columnar silicon layers forming access transistors are different in shape and the columnar silicon layers forming driver transistor are different in size. In the loadless 4T-SRAM of the present invention, the leak current of access transistors should be larger than the leak current of driver transistors. The leak current of access transistors can be increased by enlarging the columnar silicon layers forming access transistors as shown in FIG. 17.

On the other hand, for improving the reading margin, the columnar silicon layers of driver transistors are enlarged so as to increase the current of the driver transistors, whereby the reading margin can be improved, In this embodiment, the same layout as in Embodiment 1 is employed by way of example. In practice, it is not restricted to the layout of Embodiment 1 and this embodiment can similarly apply to the layouts of the other embodiments.

As mentioned in Embodiment 1, the word line, bit lines, power supply potential wire, and ground potential wire are desirably provided in a layer above the node connection wires or intra-memory cell wires so as to be shared with the other memory cells. In this regard, for example, the same hierarchical wire configuration as in Embodiment 1 can be attained.

Except for this point, the same structure as in Embodiment 1 is employed and further explanation is omitted.

(Embodiment 6)

Figure 18:
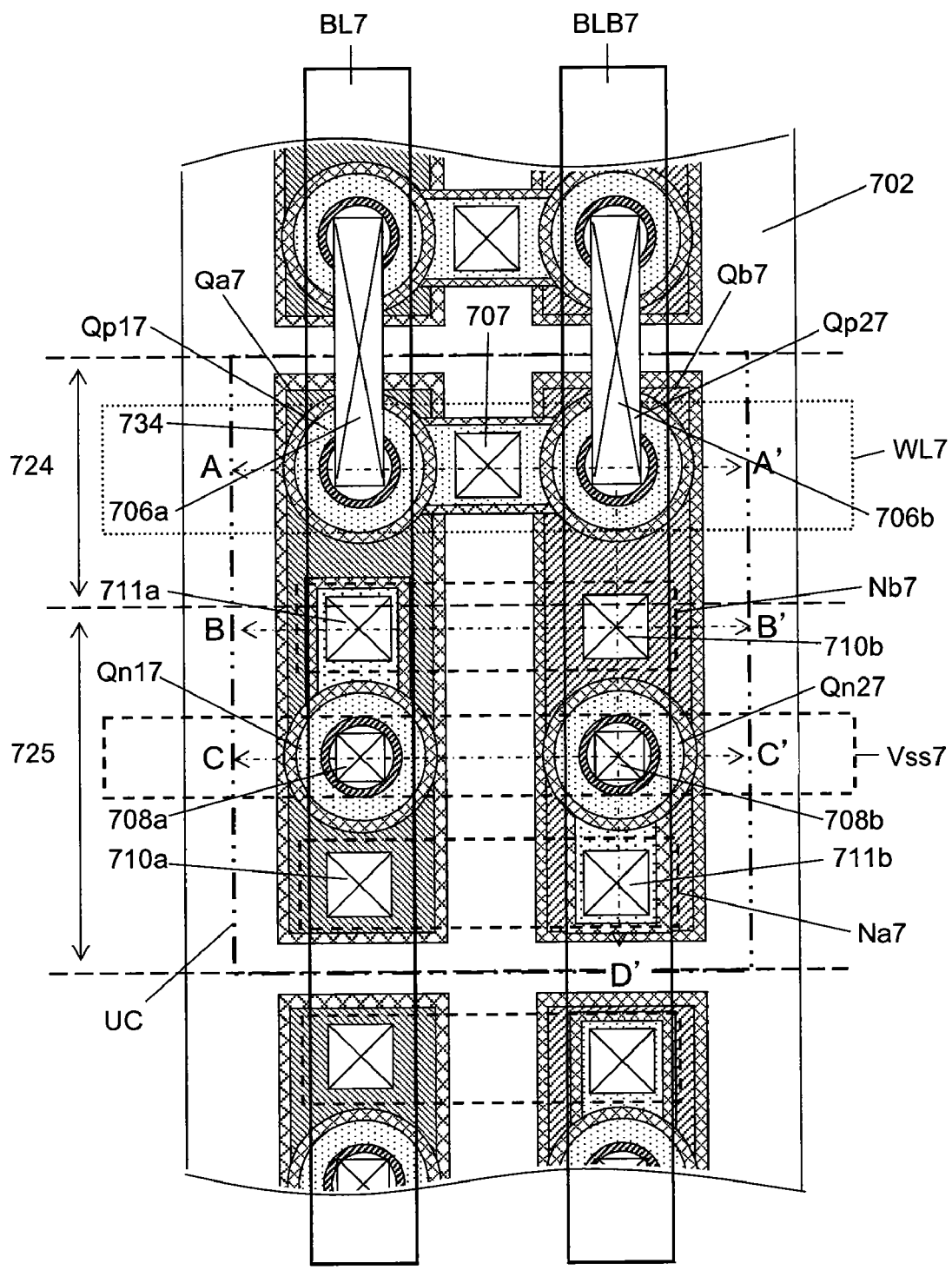
FIG. 18 is a plane view of an SRAM according to Embodiment 6 of the present invention.
Figure 19A:
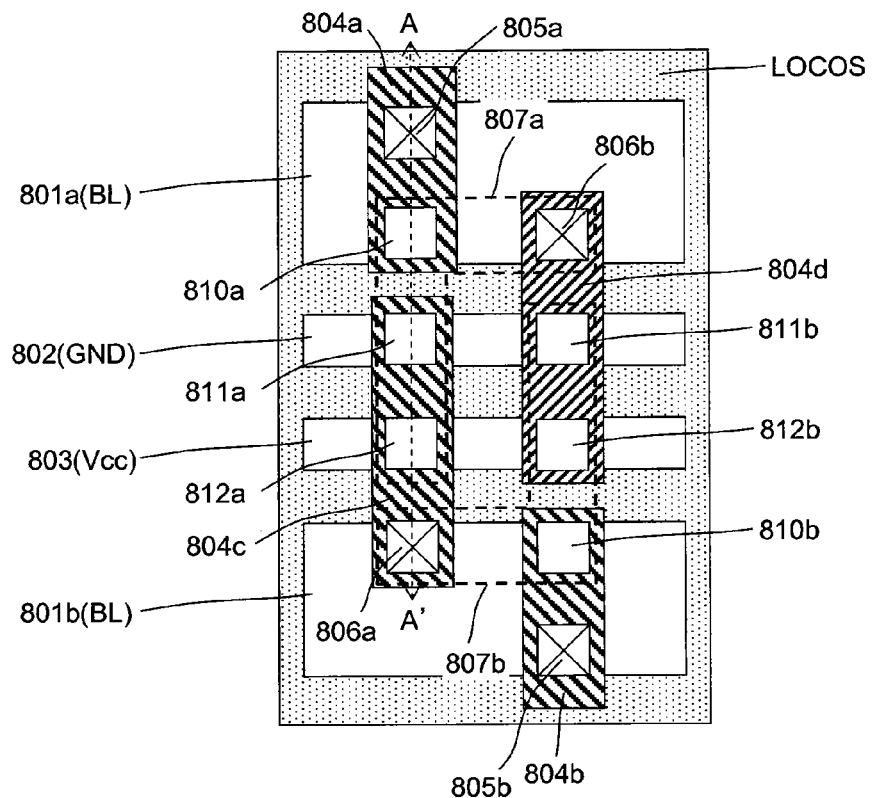
FIG. 19A is a plane view of a prior art SRAM using SGTs.
Figure 19B:
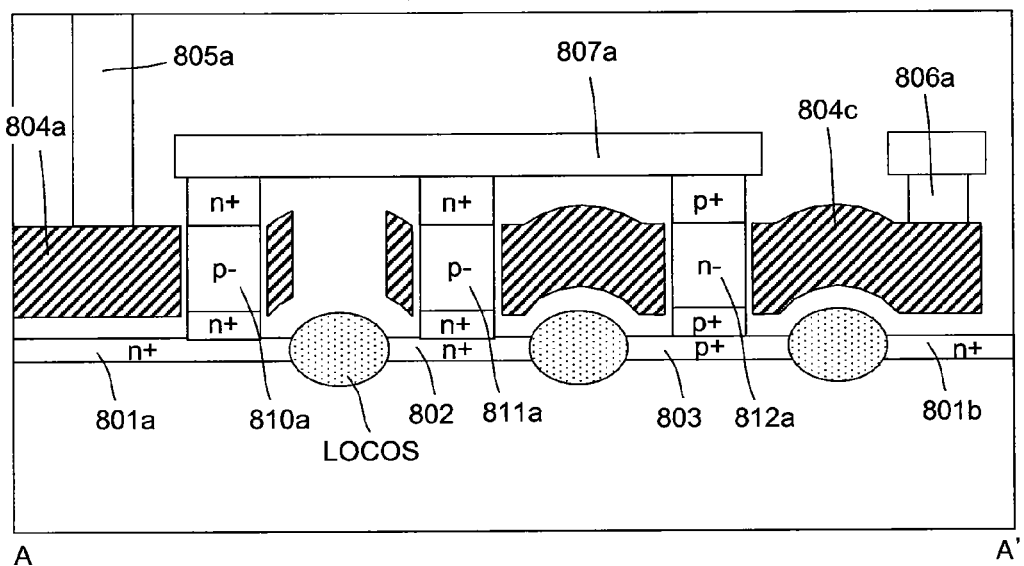
FIG. 19B is a cross-sectional view of the prior art SRAM using SGTs.

FIG. 18 is a plane view of the SRAM of Embodiment 6 of the present invention. This embodiment is different from Embodiment 1 in the flowing point. In this embodiment, the cells, at immediately upper and lower positions in the plane of the sheet face of the figure, of the SRAM cell shown as the unit cell UC are inverted from Embodiment 1. Contacts (706a, 706b) formed on access transistors (Qb17, Qb27) and connected to bit lines are common contacts also used as the contacts of the SRAM cell, at immediately upper positions in the plane of the sheet face of the figure, that are connected to the bit lines. With the contacts connected to the bit lines being shared with an adjoining cell in this way, the contacts (706a, 706b) can be increased in size and easy to form. Furthermore, the contacts have reduced resistance. Other than the contacts (706a, 706b), this SRAM cell has the same layout as of Embodiment 1.

In this embodiment, the same layout as in Embodiment 1 is employed by way of example. In practice, it is not restricted to the layout of Embodiment 1 and this embodiment can similarly apply to the layouts of the other embodiments.

As mentioned in Embodiment 1, the word line, bit lines, power supply potential wire, and ground potential wire are desirably provided in a layer above the node connection wires or intra-memory cell wires so as to be shared with the other memory cells. In this regard, for example, the same hierarchical wire configuration as in Embodiment 1 can be attained. Except for this point, the same structure as in Embodiment 1 is employed and further explanation is omitted.

Having described and illustrated the principles of this application by reference to one or more preferred embodiments, it should be apparent that the preferred embodiments may be modified in arrangement and detail without departing from the principles disclosed herein and that it is intended that the application be construed as including all such modifications and variations insofar as they come within the spirit and scope of the subject matter disclosed herein.

What is claimed is:

1. A semiconductor memory device comprising a static memory cell composed of four MOS transistors arranged on a substrate, wherein
   the four MOS transistors function as first and second PMOS access transistors for supplying a charge to hold memory cell data and accessing the memory, and as a first and a second NMOS driver transistors for driving memory nodes to read memory cell data, wherein the first and second PMOS access transistors comprises a P-type first diffusion layer, a first columnar semiconductor layer and a P-type second diffusion layer arranged vertically in tiers in an ascending order on the substrate, the first columnar semiconductor layer being formed around its side with a gate, and wherein the first and second NMOS driver transistors comprises an N-type third diffusion layer, a second columnar semiconductor layer and an N-type forth diffusion layer arranged vertically in tiers in an ascending order on the substrate, the columnar semiconductor layer being formed around its side with a gate;
   the first PMOS access transistor and first NMOS driver transistor adjoin each other;
   the second PMOS access transistor and second NMOS driver transistor adjoin each other;
   a first well giving a potential to the substrate and common to multiple memory cells is formed in the substrate;
   the P-type first diffusion layer formed at the bottom of the first PMOS access transistor and the N-type first diffusion layer formed at the bottom of the first NMOS driver transistor are connected to each other via a first silicide layer formed on their surfaces;
   the mutually connected P-type first diffusion layer and N-type first diffusion layer function as a first memory node for holding data stored in the memory cell;
   a first anti-leak diffusion layer having the conductivity type opposite to the first well is formed between the first N-type diffusion layer or the P-type first diffusion layer and first well in order to prevent leak between the N-type first diffusion layer or the P-type first diffusion layer and first well, wherein the first anti-leak diffusion layer has a bottom shallower than an element separator;
   the first anti-leak diffusion layer is directly connected to the P-type first diffusion layer or the first N-type diffusion layer;
   a P-type second diffusion layer formed at the bottom of the second PMOS access transistor and an N-type second diffusion layer formed at the bottom of the second NMOS driver transistor are connected to each other via a second silicide layer formed on their surfaces;
   the mutually connected P-type second diffusion layer and N-type second diffusion layer function as a second memory node for holding data stored in the memory cell;
   a second anti-leak diffusion layer having the conductivity type opposite to the first well is formed between the N-type second diffusion layer or the P-type second diffusion layer and first well in order to prevent leak between the N-type second diffusion layer or the P-type second diffusion layer and first well, wherein the second anti-leak diffusion layer has a bottom shallower than an element separator; and
   the second anti-leak diffusion layer is directly connected to the P-type second diffusion layer or the N-type second diffusion layer.

2. The semiconductor memory device according to claim 1 wherein:
   the first anti-leak diffusion layer is formed between the N-type first diffusion layer and the first well in order to prevent leak between the N-type first diffusion layer and first well;
   the first anti-leak diffusion layer is directly connected to the P-type first diffusion layer;
   the second anti-leak diffusion layer is formed between the P-type second diffusion layer and first well in order to prevent leak between the N-type second diffusion layer and first well; and
   the second anti-leak diffusion layer is directly connected to the P-type second diffusion layer.

3. The semiconductor memory device according to claim 1 wherein:
   the first anti-leak diffusion layer is formed between the P-type first diffusion layer and first well in order to prevent leak between the P-type first diffusion layer and first well;
   the first anti-leak diffusion layer is directly connected to the N-type first diffusion layer;
   the second anti-leak diffusion layer is formed between the P-type second diffusion layer and first well in order to prevent leak between the P-type second diffusion layer and first well; and
   the second anti-leak diffusion layer is directly connected to the N-type second diffusion layer.

4. The semiconductor memory device according to claim 1 wherein at least one of the contacts formed on gate wires extending from the gate electrodes of the first and second PMOS access transistors is a common contact also used as the contact formed on a gate wire extending from the gate electrode of a PMOS access transistor of an adjoining memory cell.

5. The semiconductor memory device according to claim 1 wherein:
   a gate wire extending from the gate of the first NMOS driver transistor formed on the first diffusion layer functioning as the first memory node is connected by a common contact shared with the second diffusion layer functioning as the second memory node; and
   a gate wire extending from the gate of the second NMOS driver transistor formed on the second diffusion layer functioning as the second memory node is connected by a common contact shared with the first diffusion layer functioning as the first memory node.

6. The semiconductor memory device according to claim 1 wherein:
   the circumference of the sidewalls of the columnar semiconductor layers forming the first and second NMOS driver transistors are equal to or longer than the circumference of the sidewalls of the columnar semiconductor layers forming the first and second PMOS access transistors; or
   the circumference of the sidewalls of the columnar semiconductor layers forming the first and second NMOS driver transistors are equal to or smaller than the circumference of the sidewalls of the columnar semiconductor layers forming the first and second PMOS access transistors.

7. The semiconductor memory device according to claim 1 wherein:
   the four MOS transistors are arranged in two rows and two columns on the substrate;
   the first PMOS access transistor is arranged at the row 1 column 1;
   the first NMOS driver transistor is arranged at the row 2 column 1;
   the second PMOS access transistor is arranged at the row 1 column 2; and
   the second NMOS driver transistor is arranged at the row 2 column 2.

8. The semiconductor memory device according to claim 7 wherein the contact formed on a gate wire extending from the gate electrodes of the first and second PMOS access transistors is shared.

9. The semiconductor memory device according to claim 1 wherein the four MOS transistors are arranged in the following manner:
   the first PMOS access transistor and second PMOS access transistor adjoin each other;
   a first contact is so provided on the first diffusion layer as to adjoin the first PMOS access transistor in one direction orthogonal to the adjoining direction of the first and second PMOS access transistors;
   a second contact is so provided on the second diffusion layer as to adjoin the second PMOS access transistor in the other direction orthogonal to the adjoining direction of the first and second PMOS access transistors;
   the first NMOS driver transistor adjoins the first PMOS access transistor in one direction orthogonal to the adjoining direction of the first and second PMOS access transistors; and
   the second NMOS driver transistor adjoins the second PMOS access transistor in the other direction orthogonal to the adjoining direction of the first and second PMOS access transistors.

10. The semiconductor memory device according to claim 1 wherein the four MOS transistors are arranged in the following manner:
    the first PMOS access transistor and second PMOS access transistor adjoin each other;
    the first NMOS driver transistor adjoins the first PMOS access transistor in one direction orthogonal to the adjoining direction of the first and second PMOS access transistors;
    a third contact is formed on the diffusion layer between the first NMOS driver transistor and first PMOS access transistor;
    the second NMOS driver transistor adjoins the second PMOS access transistor in the other direction orthogonal to the adjoining direction of the first and second PMOS access transistors; and
    a fourth contact is formed on the diffusion layer between the second NMOS driver transistor and second PMOS access transistor.

11. The semiconductor memory device according to claim 1 wherein at least one of the contacts formed in the upper parts of the columnar semiconductor layers forming the first and second PMOS access transistors is a common contact also used as the contact formed in the upper part of a columnar semiconductor layer forming a PMOS access transistor of an adjoining memory cell.

12. A method of producing the semiconductor memory device according to claim 1 wherein the contacts formed on the columnar semiconductor layers and the contacts formed on the substrate or contacts formed on the gate wires are formed in different lithography steps or etching steps.

* * * * *

UNITED STATES PATENT AND TRADEMARK OFFICE
CERTIFICATE OF CORRECTION

| | | |
|---|---|---|
| PATENT NO. | : 8,169,030 B2 | Page 1 of 1 |
| APPLICATION NO. | : 12/881554 | |
| DATED | : May 1, 2012 | |
| INVENTOR(S) | : Fujio Masuoka et al. | |

It is certified that error appears in the above-identified patent and that said Letters Patent is hereby corrected as shown below:

In the Claims

In column 13, claim 1, line 58, before "diffusion layer" replace "forth" with --fourth--.

In column 14, claim 1, lines 10-11, after "formed between the" replace "first N-type" with --N-type first--.

In column 14, claim 1, line 17, after "diffusion layer or the" replace "first N-type" with --N-type first--.

Signed and Sealed this
Thirty-first Day of July, 2012

David J. Kappos
*Director of the United States Patent and Trademark Office*